United States Patent
Yamada

(10) Patent No.: US 9,071,167 B2
(45) Date of Patent: Jun. 30, 2015

(54) COMPOUND SEMICONDUCTOR DEVICE AND METHOD FOR MANUFACTURING THE SAME

(71) Applicant: FUJITSU LIMITED, Kawasaki-shi, Kanagawa (JP)

(72) Inventor: Atsushi Yamada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/250,513

(22) Filed: Apr. 11, 2014

(65) Prior Publication Data
US 2014/0218992 A1 Aug. 7, 2014

Related U.S. Application Data

(60) Division of application No. 13/587,051, filed on Aug. 16, 2012, now Pat. No. 8,748,861, and a continuation of application No. PCT/JP2010/053258, filed on Mar. 1, 2010.

(51) Int. Cl.
*H01L 29/66* (2006.01)
*H02M 7/537* (2006.01)
(Continued)

(52) U.S. Cl.
CPC ........... *H02M 7/537* (2013.01); *H01L 29/2003* (2013.01); *H01L 29/402* (2013.01);
(Continued)

(58) Field of Classification Search
CPC .............. H01L 29/2003; H01L 29/402; H01L 29/42316; H01L 29/66462; H01L 29/7787; H01L 29/66431; H03F 1/3247; H03F 2200/304; H02M 7/537

USPC ................ 438/104, 172, 48; 257/11, 12, 192, 257/E21.409, E29.081
See application file for complete search history.

(56) References Cited

U.S. PATENT DOCUMENTS 4,807,002 A 2/1989 Donzelli
4,871,687 A 10/1989 Donzelli
(Continued)

FOREIGN PATENT DOCUMENTS

JP S61-181170 8/1986
JP H03-055853 3/1991
(Continued)

OTHER PUBLICATIONS

International Search Report for International Application No. PCT/JP2010/053258 dated Jun. 1, 2010.
(Continued)

*Primary Examiner* — Thinh T Nguyen
(74) *Attorney, Agent, or Firm* — Kratz, Quintos & Hanson, LLP

(57) ABSTRACT

An AlGaN/GaN-HEMT has a structure including: compound semiconductor layers formed on a substrate; a gate electrode, a gate pad that has a current path formed between the gate electrode and itself, and a semiconductor layer that is spontaneously polarized and piezoelectrically polarized, which are formed on the compound semiconductor layer; and a gate electrode connection layer formed on the semiconductor layer, wherein the gate electrode connection layer and the gate electrode are electrically connected with each other. This structure which is relatively simple allows the AlGaN/GaN-HEMT to realize an intended normally-off operation without causing such inconveniences as increase in a sheet resistance, increase in an on-resistance, and increase in a leakage current.

8 Claims, 22 Drawing Sheets

(51) Int. Cl.
*H01L 29/20* (2006.01)
*H01L 29/40* (2006.01)
*H01L 29/423* (2006.01)
*H01L 29/778* (2006.01)
*H03F 1/32* (2006.01)

(52) U.S. Cl.
CPC .... *H01L29/42316* (2013.01); *H01L 29/66462* (2013.01); *H01L 29/7787* (2013.01); *H03F 1/3247* (2013.01); *H03F 2200/204* (2013.01); *H03F 2200/541* (2013.01); *H01L 29/66431* (2013.01)

(56) References Cited

U.S. PATENT DOCUMENTS

| | | | |
|---|---|---|---|
| 7,038,252 B2 | 5/2006 | Saito et al. | |
| 7,508,015 B2 | 3/2009 | Saito et al. | |
| 7,538,718 B2 | 5/2009 | Ikeda et al. | |
| 7,737,467 B2 | 6/2010 | Saito et al. | |
| 7,741,637 B2* | 6/2010 | Nakahara et al. | 257/43 |
| 7,777,305 B2* | 8/2010 | Kuroda et al. | 257/624 |
| 7,859,021 B2 | 12/2010 | Kaneko | |
| 7,985,987 B2 | 7/2011 | Kaneko | |
| 8,076,698 B2 | 12/2011 | Ueda et al. | |
| 2005/0189559 A1 | 9/2005 | Saito et al. | |
| 2006/0138454 A1 | 6/2006 | Saito et al. | |
| 2007/0200143 A1 | 8/2007 | Saito et al. | |
| 2008/0173898 A1 | 7/2008 | Ohmaki | |
| 2008/0180313 A1 | 7/2008 | Ikeda et al. | |
| 2008/0217625 A1* | 9/2008 | Kuroda et al. | 257/76 |
| 2009/0034568 A1 | 2/2009 | Nakahara et al. | |
| 2009/0057720 A1 | 3/2009 | Kaneko | |
| 2009/0121775 A1 | 5/2009 | Ueda et al. | |
| 2009/0200545 A1* | 8/2009 | Nakahara et al. | 257/43 |
| 2009/0230482 A1* | 9/2009 | Kato et al. | 257/392 |
| 2011/0062438 A1 | 3/2011 | Kaneko | |

FOREIGN PATENT DOCUMENTS

| | | |
|---|---|---|
| JP | 2005-244072 A1 | 9/2005 |
| JP | 2007-19309 A1 | 1/2007 |
| JP | 2007-59589 A1 | 3/2007 |
| JP | 2008-026901 A1 | 2/2008 |
| JP | 2008-209382 A1 | 9/2008 |
| JP | 2008-277640 A1 | 11/2008 |
| JP | 2009-32713 A1 | 2/2009 |
| JP | 2009-71061 A1 | 4/2009 |
| JP | 2009-76845 A1 | 4/2009 |
| WO | WO 2007/007548 A1 | 1/2007 |

OTHER PUBLICATIONS

International Preliminary Report on Patentability mailed Sep. 13, 2012 in counterpart application No. PCT/JP2010/053258.

* cited by examiner

COMPOUND SEMICONDUCTOR DEVICE AND METHOD FOR MANUFACTURING THE SAME

CROSS-REFERENCE TO RELATED APPLICATIONS

This application is a Divisional application of Ser. No. 13/587,051 filed on Aug. 16, 2012, which is a continuation application of international application PCT/JP2010/053258 filed on Mar. 1, 2010 and designated the U.S., the entire contents of both of which are incorporated herein by reference.

FIELD

The present embodiments relate to a compound semiconductor device provided with a layer of a compound semiconductor such as a nitride semiconductor, and a method for manufacturing the same.

BACKGROUND

A nitride semiconductor device is under active development for use as a semiconductor device with high-voltage resistance and high output, by making use of the feature of a high saturation electron speed, a wide band gap and the like. As for the nitride semiconductor device, there have been a large number of reports on a field effect transistor, and particularly on a high electron mobility transistor (HEMT). In particular, an AlGaN/GaN-HEMT has received attention, which uses GaN as an electron transit layer and AlGaN as an electron supply layer. In the AlGaN/GaN-HEMT, distortion occurs in AlGaN, which originates in the difference between the lattice constants of GaN and AlGaN. A high concentration of two-dimensional electron gas (2D EG) is obtained due to the piezo polarization generated by the distortion and the spontaneous polarization of AlGaN. Because of this, high-voltage resistance and a high output can be realized.

CITATION LIST

Patent Literature

[Patent Literature 1]: Japanese Laid-Open Patent Publication No. 2007-19309
[Patent Literature 2]: Japanese Laid-Open Patent Publication No. 2005-244072
[Patent Literature 3]: Japanese Laid-Open Patent Publication No. 2008-277640
[Patent Literature 4]: Japanese Laid-Open Patent Publication No. 2009-71061
[Patent Literature 5]: Japanese Laid-Open Patent Publication No. 2009-76845

A so-called normally-off operation, in which an electric current does not flow when voltage is turned off, is desirable for a switching element used in a power-supply unit and the like. However, a problem with the AlGaN/GaN-HEMT is that the concentration of the two-dimensional electron gas is high, thereby the quantity of electrons in a channel region is also large and the normally-off operation is difficult to be realized.

Technologies directed to the normally-off operation in the AlGaN/GaN-HEMT are proposed (see Patent Literatures 1 to 5). However, these technologies cannot realize the complete or sufficient normally-off operation. It is also difficult for the technologies to avoid inconveniences such as increases in sheet resistance and a leakage current caused by damage to a transit region of electrons due to heat treatment and the like in a manufacturing process, and an increase in on-resistance caused by a decrease in the concentration of the two-dimensional electron gas.

SUMMARY

One embodiment of a compound semiconductor device includes: a substrate; a compound semiconductor layer formed above the substrate; a gate electrode formed above the compound semiconductor layer; a gate pad that is formed above the compound semiconductor layer and has a current path formed between the gate electrode and itself; a semiconductor layer that is formed above the compound semiconductor layer and is spontaneously polarized; and a gate connection layer formed on the semiconductor layer, wherein the gate connection layer and the gate electrode are electrically connected with each other.

One embodiment of a method for manufacturing a compound semiconductor device includes: forming a compound semiconductor layer above a substrate; forming a gate electrode above the compound semiconductor layer; forming a gate pad that has a current path formed between the gate electrode and itself, above the compound semiconductor layer; forming a semiconductor layer that is spontaneously polarized, above the compound semiconductor layer; and forming a gate connection layer on the semiconductor layer, wherein the gate connection layer and the gate electrode are electrically connected with each other.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Embodiments will be described in detail below with reference to the drawings. In the following embodiments, the structure of a compound semiconductor device will be described together with a method for manufacturing the same. In the following embodiments, an AlGaN/GaN-HEMT is disclosed as the compound semiconductor device. In the following drawings, there is a component of which the relatively exact size and thickness are not depicted for the convenience of illustration. In the embodiments, elements are isolated with a predetermined element isolation method, for instance, with an STI (Shallow Trench Isolation) method, a predetermined ion-injection technique or the like.

First Embodiment

Figure 1:
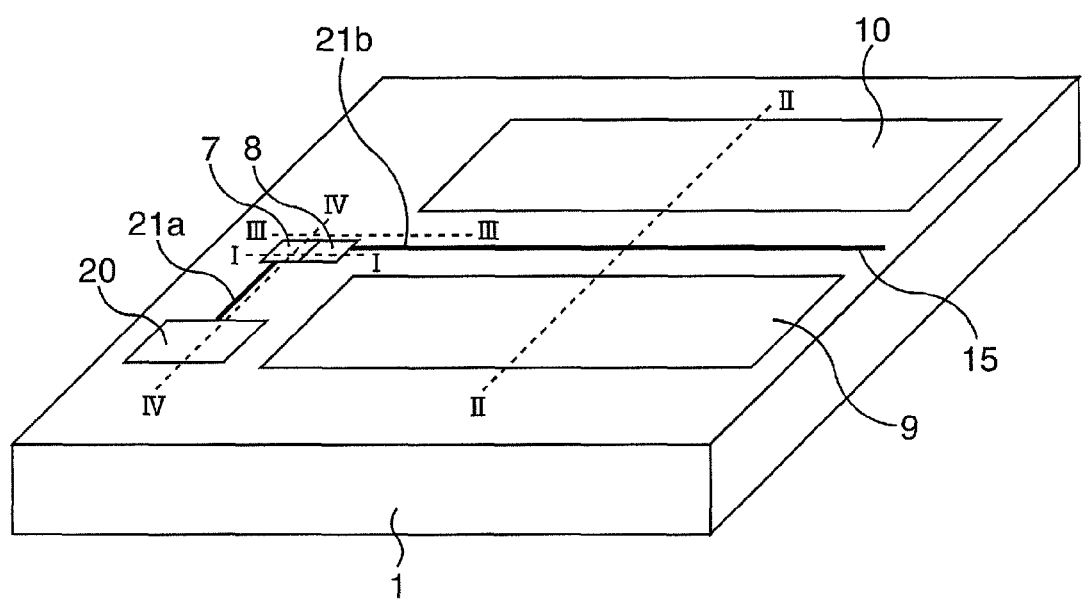
FIG. 1 is a plan view illustrating a schematic structure of a compound semiconductor device according to a first embodiment.
Figure 3A:
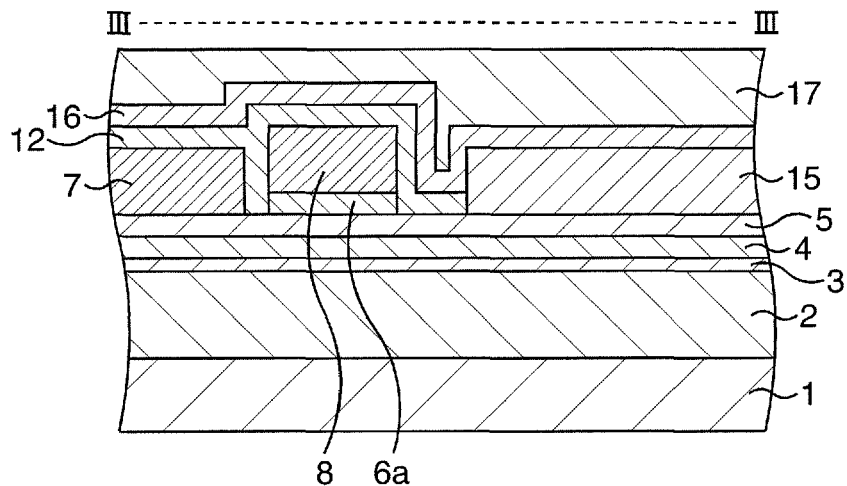
FIG. 3A is a schematic sectional view illustrating a part of steps in the method for manufacturing the compound semiconductor device according to the first embodiment.
Figure 3B:
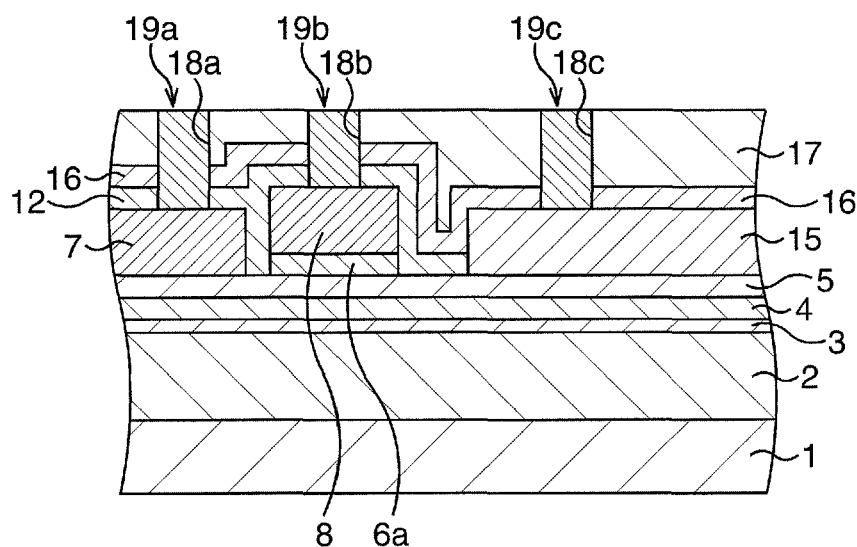
FIG. 3B is a schematic sectional view illustrating a part of steps in the method for manufacturing the compound semiconductor device according to the first embodiment.
Figure 3C:
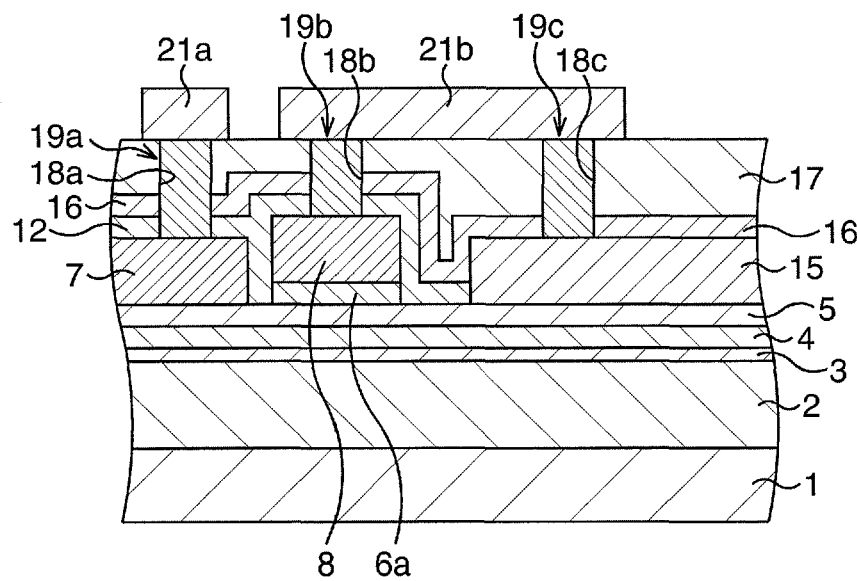
FIG. 3C is a schematic sectional view illustrating a part of steps in the method for manufacturing the compound semiconductor device according to the first embodiment.
Figure 4:
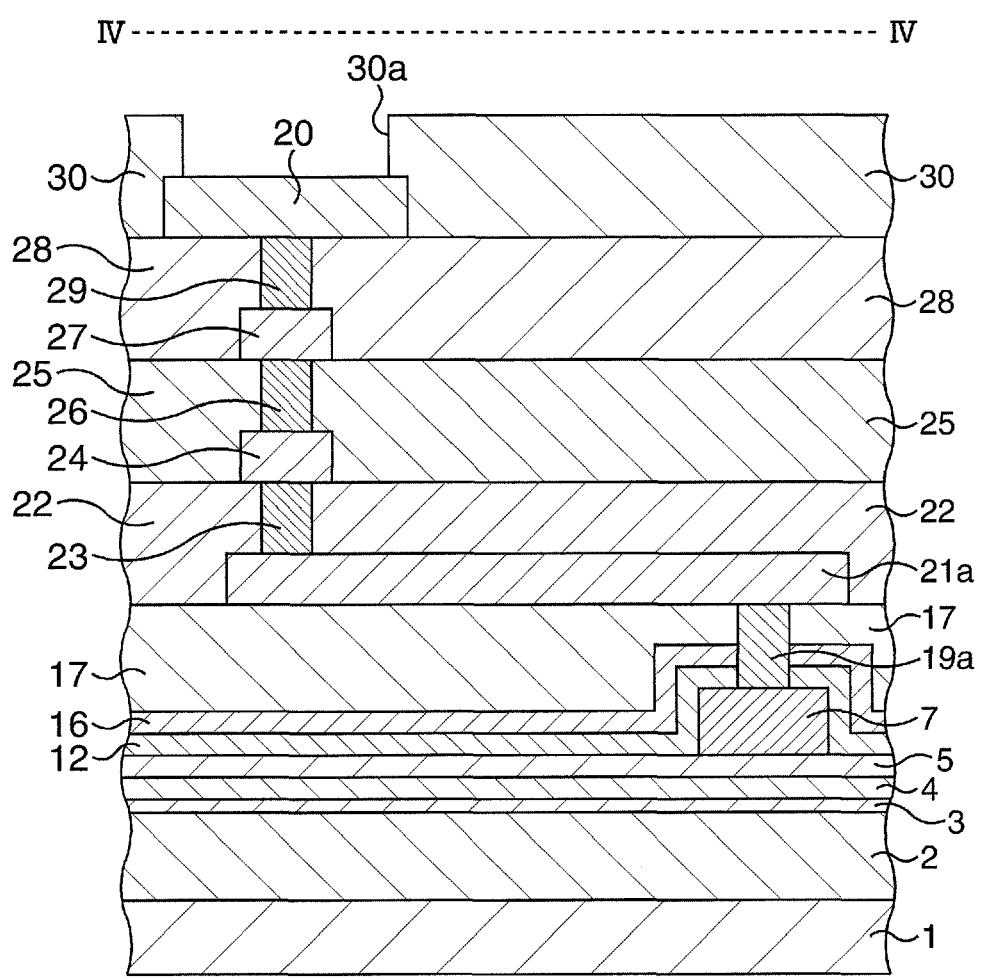
FIG. 4 is a schematic sectional view illustrating a part of steps in the method for manufacturing the compound semiconductor device according to the first embodiment.

FIG. 1 is a plan view illustrating a schematic structure of a compound semiconductor device according to a first embodiment. FIGS. 2A to 2J are schematic sectional views illustrating a method for manufacturing the compound semiconductor device according to the first embodiment, in order of the steps. FIGS. 3A to 3C are schematic sectional views illustrating a part of steps in the method for manufacturing the compound semiconductor device according to the first embodiment. FIG. 4 is a schematic sectional view illustrating a part of steps in the method for manufacturing the compound semiconductor device according to the first embodiment. A cross section taken along a dashed line I-I and a dashed line II-II of FIG. 1 corresponds to FIGS. 2A to 2J, a cross section taken along a dashed line corresponds to FIGS. 3A to 3C, and a cross section taken along a dashed line IV-IV corresponds to FIG. 4, respectively.

Figure 2A:
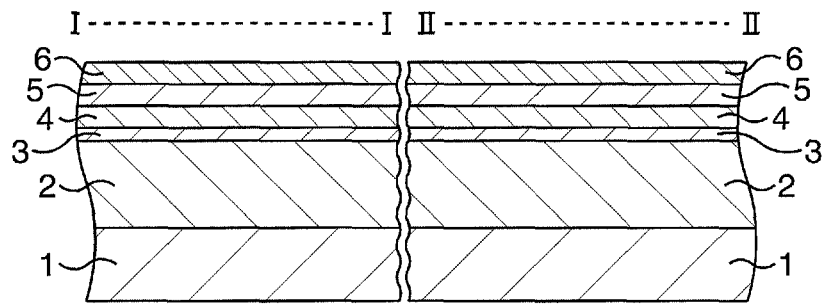
FIG. 2A is a schematic sectional view illustrating a method for manufacturing a compound semiconductor device according to the first embodiment.

First, as is illustrated in FIG. 2A, an electron transit layer 2, an intermediate layer 3, an electron supply layer 4, a cap layer 5 and a semiconductor layer 6 are sequentially formed on, for instance, a semi-insulating SiC substrate 1 which is a substrate for growing semiconductors thereon. In the AlGaN/GaN-HEMT, a two-dimensional electron gas (2D EG) is generated in the vicinity of the interface (intermediate layer 3 to be direct) between the electron transit layer 2 and the electron supply layer 4.

The electron transit layer 2 is an intentionally undoped GaN (i-GaN) layer, the intermediate layer 3 is an AlGaN layer (i-AlGaN layer, here), the electron supply layer 4 is an n-AlGaN layer, and the cap layer 5 is an n-GaN layer. For information, the electron supply layer 4 may be an intentionally undoped AlGaN (i-AlGaN) layer.

The semiconductor layer 6 is formed from a semiconductor having properties of being piezoelectrically polarized which are referred to as a piezoelectric effect and being spontaneously polarized, for instance, from a hexagonal nitride semiconductor or a hexagonal oxide semiconductor on the basis of a relationship between the semiconductor and the GaN of the electron transit layer 2. The nitride semiconductor is preferably one selected from GaN, AlN, InN, AlGaN, InGaN, InAlN and InAlGaN, for instance. The oxide semiconductor is preferably ZnO or ZnMgO, for instance. In the present embodiment, n-AlGaN is used as the semiconductor layer 6.

Specifically in FIG. 2A, each of the following compound semiconductor layers is grown on the SiC substrate 1, for instance, with a metal organic vapor phase epitaxy (MOVPE) method, by using a crystal growth apparatus.

The i-GaN, the i-AlGaN, the n-AlGaN, the n-GaN and the n-AlGaN are sequentially deposited on the SiC substrate 1, and the electron transit layer 2, the intermediate layer 3, the electron supply layer 4, the cap layer 5 and the semiconductor layer 6 are sequentially stacked and formed thereon. Here, the electron transit layer 2 is formed so as to have a film thickness of approximately 2 μm; the intermediate layers 3 is formed so as to have a film thickness of approximately 5 nm and an Al ratio of 0.2, for instance; the electron supply layer 4 is formed so as to have a film thickness of approximately 30 nm and an Al ratio of 0.2, for instance; the cap layer 5 is formed so as to have a film thickness of approximately 10 nm; and the semiconductor layer 6 is formed so as to have a film thickness of approximately 5 nm and an Al ratio of 0.2, for instance.

As for the growing conditions of the i-GaN, the i-AlGaN, the n-GaN and the n-AlGaN, a mixture gas of trimethylaluminum gas, trimethylgallium gas and ammonia gas is used as a source gas. The presence or absence of the supply of trimethylaluminum gas which is a source of Al and trimethylgallium gas which is a source of Ga and the flow rate of each gas are appropriately set according to the type of growing compound semiconductor layers. The flow rate of the ammonia gas which is a common raw material is set at approximately 100 ccm to 10 LM. In addition, a growth pressure is set at approximately 50 Torr to 300 Torr, and a growth temperature is set at approximately 1,000° C. to 1,200° C. When the n-GaN and the n-AlGaN are grown, $SiH_4$ gas, for instance, containing Si, for instance, as n-type impurities is added to the source gas at a predetermined flow rate to dope the GaN and the AlGaN with Si. A doping concentration by Si is set in a range of approximately $1\times10^{18}/cm^3$ to approximately $1\times10^{20}/cm^3$, and approximately at $1\times10^{18}/cm^3$, for instance.

Figure 2B:
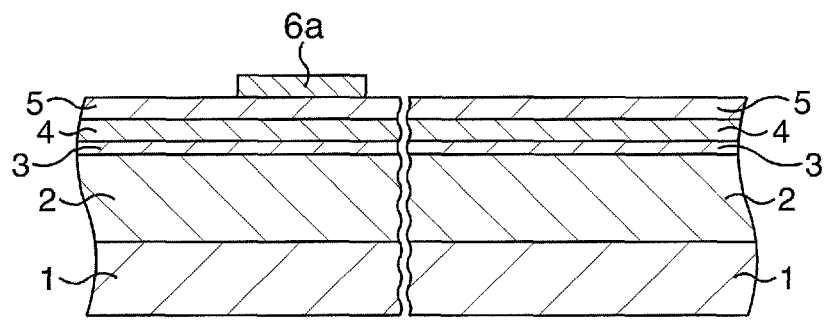
FIG. 2B is a schematic sectional view which follows FIG. 2A and illustrates the method for manufacturing the compound semiconductor device according to the first embodiment.

Subsequently, the semiconductor layer 6 is patterned and a gate control layer 6a is formed, as is illustrated in FIG. 2B.

Specifically, first, the semiconductor layer 6 is processed by lithography and dry etching, and is left only at a site at which a gate electrode connection layer is formed which will be described later.

Thereby, the gate control layer 6a is formed. A resist used for the lithography is removed by ashing or the like.

Figure 2C:
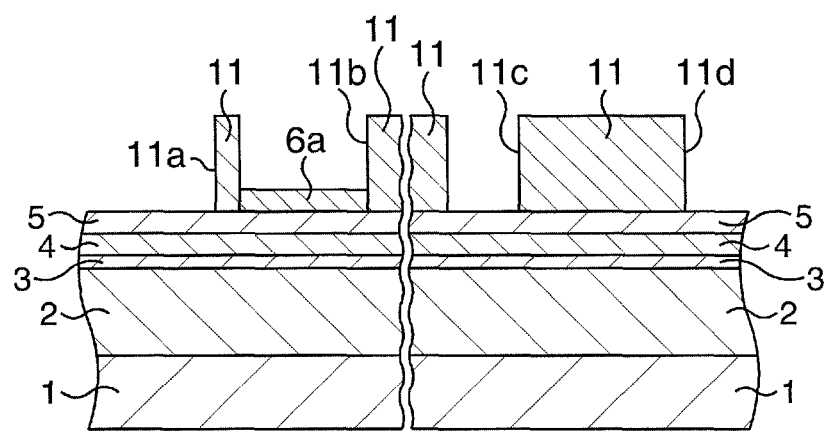
FIG. 2C is a schematic sectional view which follows FIG. 2B and illustrates the method for manufacturing the compound semiconductor device according to the first embodiment.

Subsequently, a resist mask 11 is formed as is illustrated in FIG. 2C.

Specifically, the resist is applied onto the SiC substrate 1, and is processed with the lithography. Thereby, the resist mask 11 is formed which has apertures 11a, 11b, 11c and 11d therein. The aperture 11a is formed so that a site on the surface of the cap layer 5, at which a gate pad connection layer is formed, is exposed to the outside. The aperture 11b is formed so that a site (in other words, surface of gate control layer 6a) is exposed to the outside, at which a gate electrode connection layer is formed. The aperture 11c is formed so that a site on the surface of the cap layer 5, at which a source electrode is formed, is exposed to the outside. The aperture 11d is formed so that a site on the surface of the cap layer 5, at which a drain electrode is formed, is exposed to the outside.

Figure 2D:
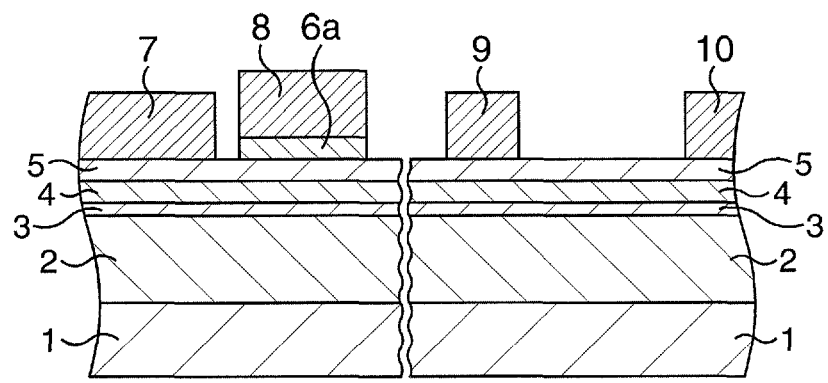
FIG. 2D is a schematic sectional view which follows FIG. 2C and illustrates the method for manufacturing the compound semiconductor device according to the first embodiment.

Subsequently, the gate pad connection layer 7, the gate electrode connection layer 8, the source electrode 9 and the drain electrode 10 are formed, as is illustrated in FIG. 2D.

Specifically, Ti/Al, for instance, is used as the electrode material and is deposited on the resist mask 11 so as to be embedded in the apertures 11a, 11b, 11c and 11d, with a vapor deposition method or the like. The resist mask 11 and Ti/Al having deposited on the resist mask 11 are removed with a lift-off method. After that, the SiC substrate 1 is heat-treated, for instance, in a nitrogen atmosphere at approximately 600° C., and an ohmic contact is established. By the above operations, the gate pad connection layer 7, the gate electrode connection layer 8 having the interposed gate control layer 6a, the source electrode 9 and the drain electrode 10 are formed on the cap layer 5. Here, clearance between the gate pad connection layer 7 and the gate electrode connection layer 8 (gate control layer 6a) is set, for instance, at approximately 1 μm so that a path of a gate current is formed between the gate pad connection layer 7 and the gate electrode connection layer 8.

Figure 2E:
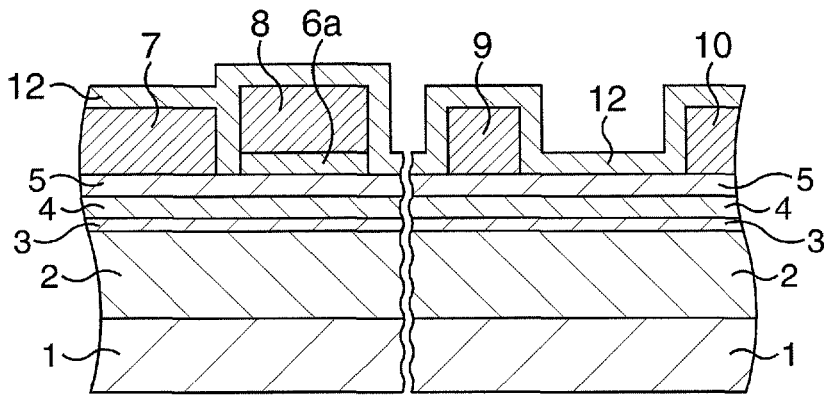
FIG. 2E is a schematic sectional view which follows FIG. 2D and illustrates the method for manufacturing the compound semiconductor device according to the first embodiment.

Subsequently, a passivation film 12 is formed as is illustrated in FIG. 2E.

Specifically, an insulation film which is an SiN film here is deposited, for instance, with a PECVD method so as to cover the whole surface of the SiC substrate 1 and have a film thickness of, for instance, approximately 200 nm. Thereby, the passivation film 12 is formed.

Figure 2F:
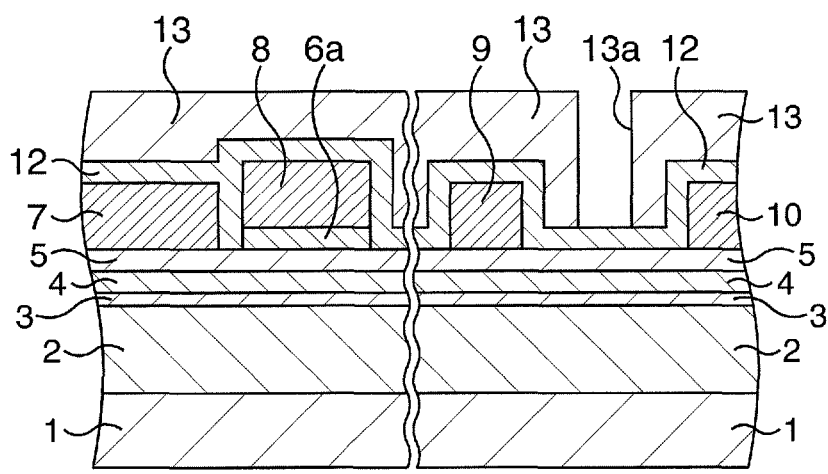
FIG. 2F is a schematic sectional view which follows FIG. 2E and illustrates the method for manufacturing the compound semiconductor device according to the first embodiment.

Subsequently, a resist mask 13 is formed as is illustrated in FIG. 2F.

Specifically, a resist is applied onto the passivation film 12 and is processed with the lithography. Thereby, the resist mask 13 is formed that has an aperture 13a at a site at which a gate electrode is formed.

Figure 2G:
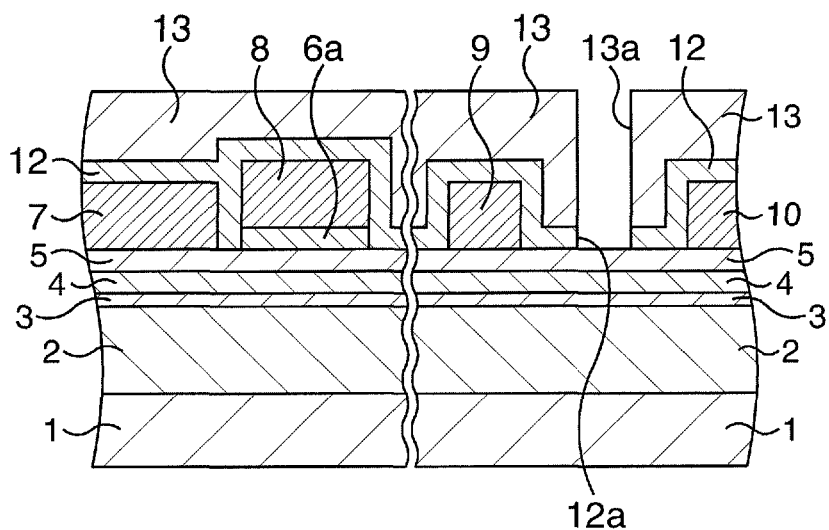
FIG. 2G is a schematic sectional view which follows FIG. 2F and illustrates the method for manufacturing the compound semiconductor device according to the first embodiment.

Subsequently, an aperture 12a is formed in the passivation film 12 as is illustrated in FIG. 2G.

Specifically, the passivation film 12 is processed with the dry etching while using the resist mask 13 as the mask, and the passivation film 12 at a site to be exposed to the outside from the aperture 13a is removed. Thereby, the aperture 12a that exposes the site at which a gate electrode that will be described later is formed to the outside is formed in the passivation film 12.

Figure 2H:
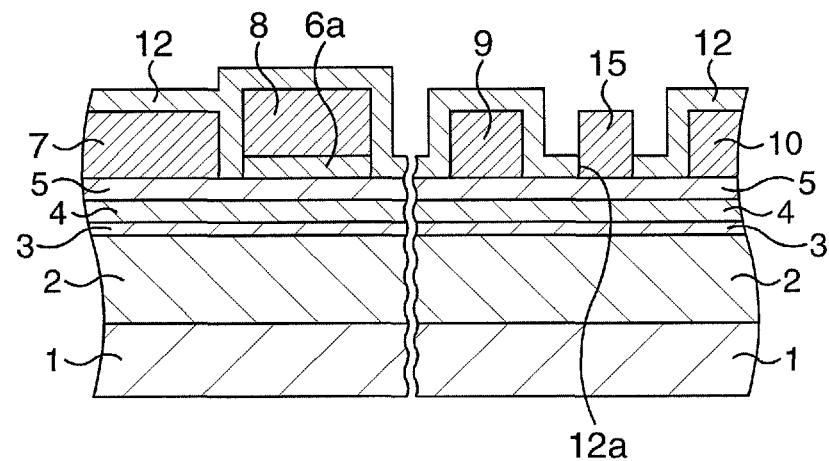
FIG. 2H is a schematic sectional view which follows FIG. 2G and illustrates the method for manufacturing the compound semiconductor device according to the first embodiment.

Subsequently, a gate electrode 15 is formed as is illustrated in FIG. 2H.

Specifically, Ni/Au, for instance, is used as the electrode material and is deposited on the resist mask 13 so as to be embedded in the aperture 12a and so as to be partially embedded in the aperture 13a, with a vapor deposition method or the like. The resist mask 13 and Ni/Au having deposited on the resist mask 13 are removed with the lift-off method. By the above operations, the gate electrode 15 is formed on the cap layer 5 so as to be embedded in the aperture 12a of the passivation film 12.

Figure 2I:
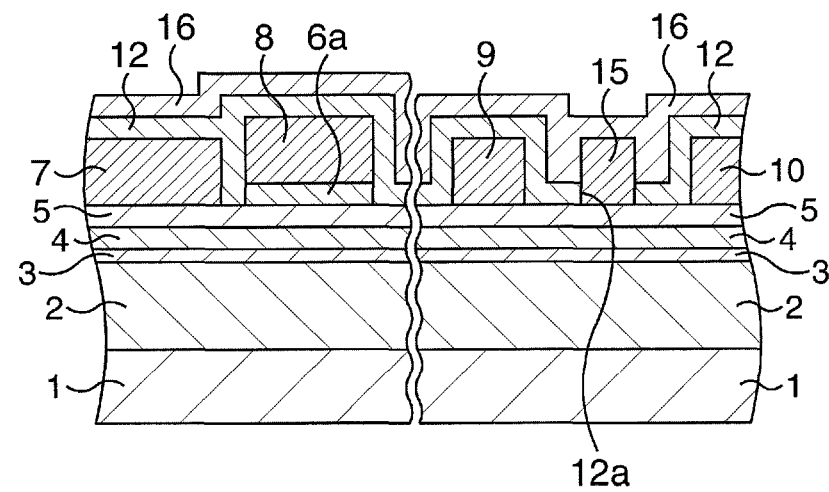
FIG. 2I is a schematic sectional view which follows FIG. 2H and illustrates the method for manufacturing the compound semiconductor device according to the first embodiment.

Subsequently, a passivation film 16 is formed as is illustrated in FIG. 2I.

Specifically, an insulation film which is an SiN film here is deposited, for instance, with a PECVD method so as to cover the passivation film 12 and the gate electrode 15 and have a film thickness of, for instance, approximately 500 nm. Thereby, the passivation film 16 is formed.

Figure 2J:
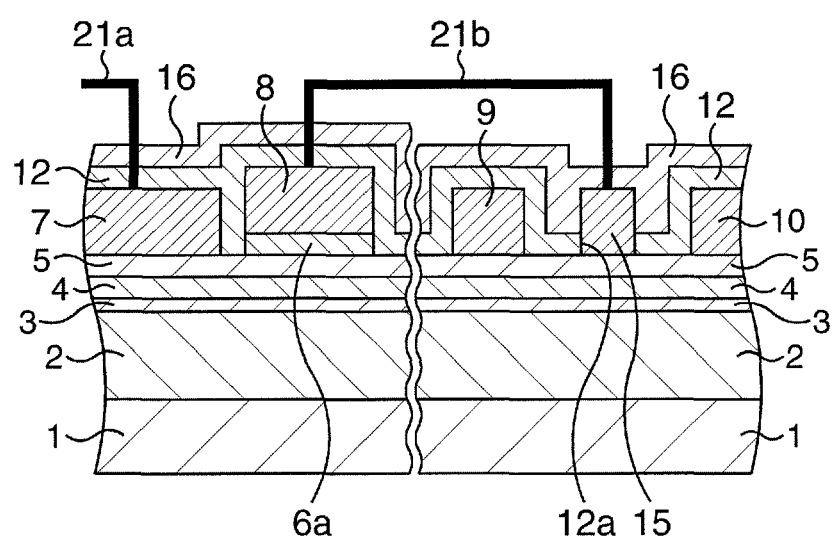
FIG. 2J is a schematic sectional view which follows FIG. 2I and illustrates the method for manufacturing the compound semiconductor device according to the first embodiment.

Subsequently, the gate pad connection layer 7 and a gate pad which will be described later are wired with each other and the gate electrode connection layer 8 and the gate electrode 15 are wired with each other, respectively as is illustrated in FIG. 2J and FIG. 1. In FIG. 2J and FIG. 1, the former connection is simply illustrated only by a wire 21a and the latter connection is simply illustrated only by a wire 21b as the wiring connection, for ease of understanding.

Each step of the wiring connections will be described below.

First, an interlayer insulation film 17 having a flat surface is formed as is illustrated in FIG. 3A.

Specifically, a silicon oxide film is deposited on the whole surface of the SiC substrate 1, for instance, with a CVD method or the like, and then is subjected to planarization or the like by a reflow process or a chemical mechanical polishing (CMP) process. Thereby, the interlayer insulation film 17 having the flat surface is formed.

Subsequently, electroconductive plugs 19a, 19b and 19c are formed as is illustrated in FIG. 3B.

Specifically, the interlayer insulation film 17 and the passivation films 16 and 12 are processed with the lithography and the dry etching, and contact holes 18a, 18b and 18c are formed. The contact hole 18a is formed in the passivation films 12 and 16 and the interlayer insulation film 17 on the gate pad connection layer 7 so that a part of the surface of the gate pad connection layer 7 is exposed to the outside. The contact hole 18b is formed in the passivation films 12 and 16 and the interlayer insulation film 17 on the gate electrode connection layer 8 so that a part of the surface of the gate electrode connection layer 8 is exposed to the outside. The contact hole 18c is formed in the passivation film 16 and the interlayer insulation film 17 on the gate electrode 15 so that a part of the surface of the gate electrode 15 is exposed to the outside.

An electroconductive material, for instance, tungsten (W), is deposited on the interlayer insulation film 17 so as to be embedded in the contact holes 18a to 18c, with a CVD method or the like. At this time, the W may also be deposited after a barrier metal such as TiN has been formed on the interlayer insulation film 17. The W is polished by the CMP by using the interlayer insulation film 17 as a polishing stopper, and is planarized. By the above described operations, the electroconductive plugs 19a, 19b and 19c are formed from W with which the inner part of the contact holes 18a to 18c are filled.

Subsequently, wires 21a and 21b are formed as is illustrated in FIG. 3C.

Specifically, a wiring metal, for instance, an Al alloy is deposited on the interlayer insulation film 17 with a sputtering method or the like. At this time, a barrier metal such as TiN may also be formed as an underlaying metal. The wiring metal is patterned by the lithography and the dry etching, and the wires 21a and 21b are formed. The wire 21a is connected with the electroconductive plug 19a and extends on the interlayer insulation film 17. The wire 21b conductively connects the gate electrode connection layer 8 with the gate electrode 15 through the electroconductive plugs 19a and 19c.

Incidentally, the source electrode 9 and the drain electrode 10 are also appropriately conducted to each other by the electroconductive plugs and the wires.

After that, the AlGaN/GaN-HEMT of the present embodiment is formed through the steps of further forming interlayer insulation films, electroconductive plugs, wires and the like.

The gate pad 20 of FIG. 1 is conductively connected to the gate pad connection layer 7, as is illustrated in FIG. 4.

Specifically, an interlayer insulation film 22 is formed on the interlayer insulation film 17 so as to cover the wires 21a and 21b, an electroconductive plug 23 which is connected with the wire 21a is formed therein, and a wire 24 which is connected with the electroconductive plug 23 is formed on the interlayer insulation film 22. An interlayer insulation film 25 is formed on the interlayer insulation film 22 so as to cover the wire 24, an electroconductive plug 26 is formed therein, and a wire 27 which is connected with the electroconductive plug 26 is formed on the interlayer insulation film 25. An interlayer insulation film 28 is formed on the interlayer insulation film 25 so as to cover the wire 27, an electroconductive plug 29 is formed therein, and the gate pad 20 which is connected with the electroconductive plug 29 is formed on the interlayer insulation film 28. Then, a protection film 30 is formed that covers the interlayer insulation film 28 and has the aperture 30a formed therein which exposes a part of the surface of the gate pad 20 to the outside.

Incidentally, FIG. 4 illustrates one example. A multilayer interlayer insulation film and a wire may also be further formed, and the gate pad 20 may be appropriately connected with the wire.

A function and an effect of the AlGaN/GaN-HEMT according to the present embodiment will be described below based on the comparison with a comparative example.

Figure 5:
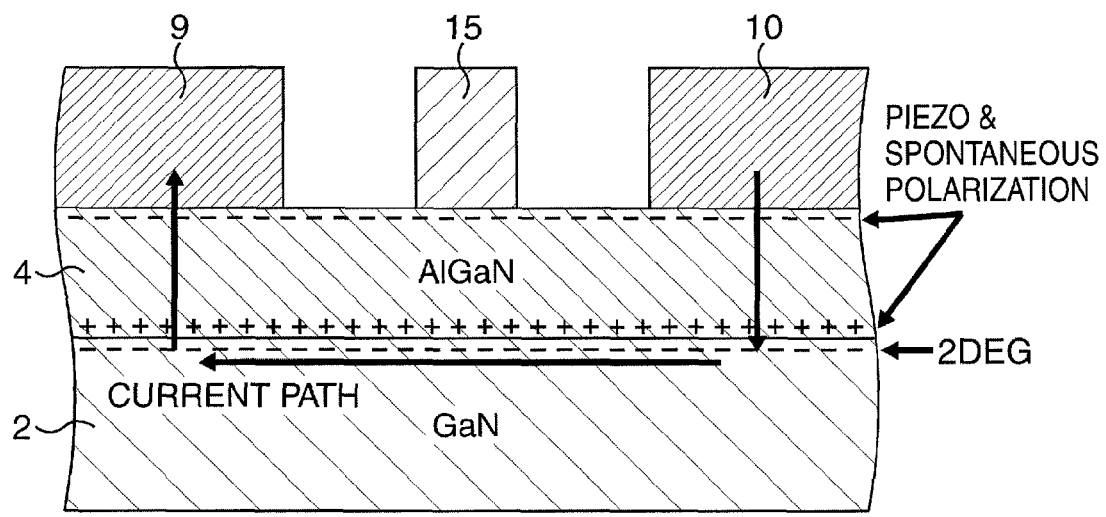
FIG. 5 is a schematic sectional view illustrating an AlGaN/GaN-HEMT of a comparative example.
Figure 6A:
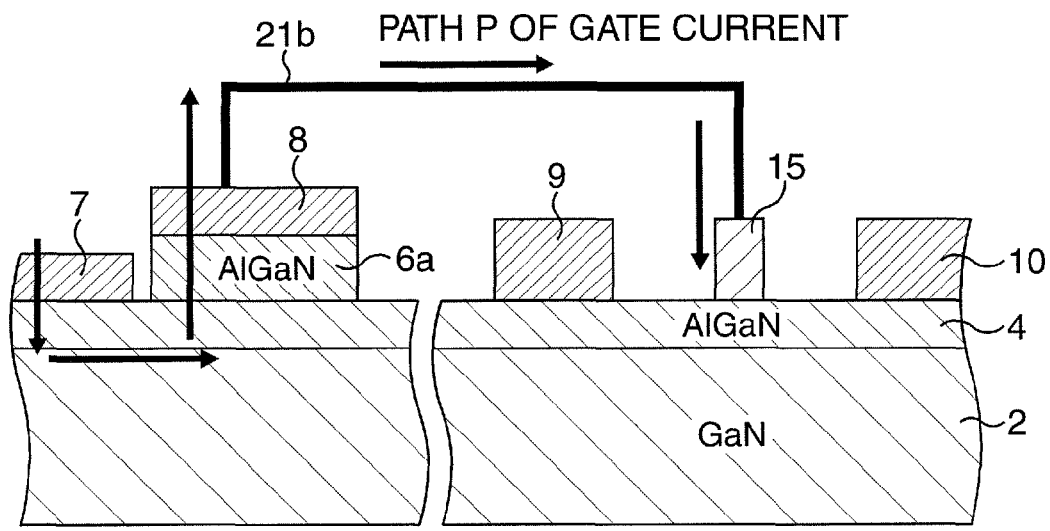
FIG. 6A is a schematic sectional view for describing a function and an effect of the AlGaN/GaN-HEMT according to the first embodiment.
Figure 6B:
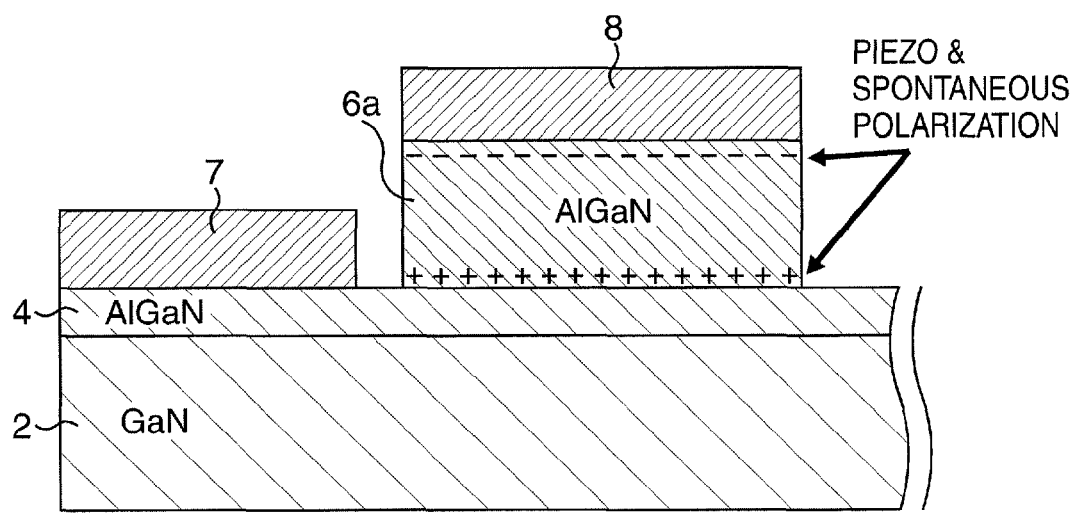
FIG. 6B is a schematic sectional view for describing a function and an effect of the AlGaN/GaN-HEMT according to the first embodiment.
Figure 7A:
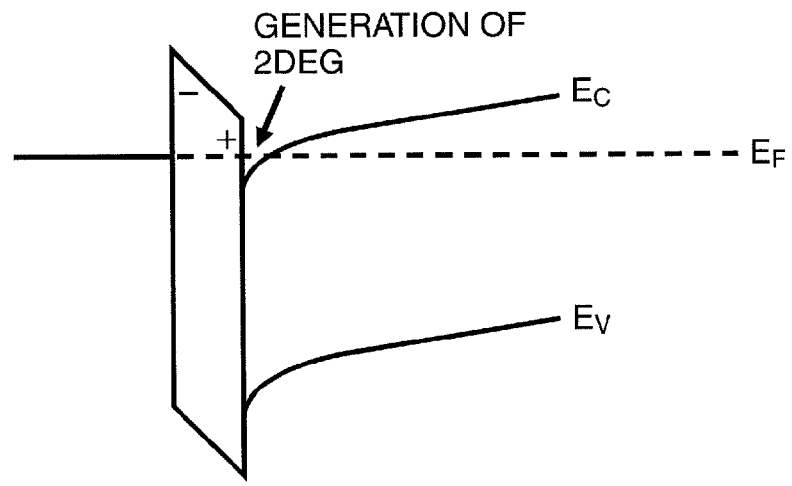
FIG. 7A is a view illustrating a band diagram of an AlGaN/GaN-HEMT according to a comparative example of the first embodiment.
Figure 7B:
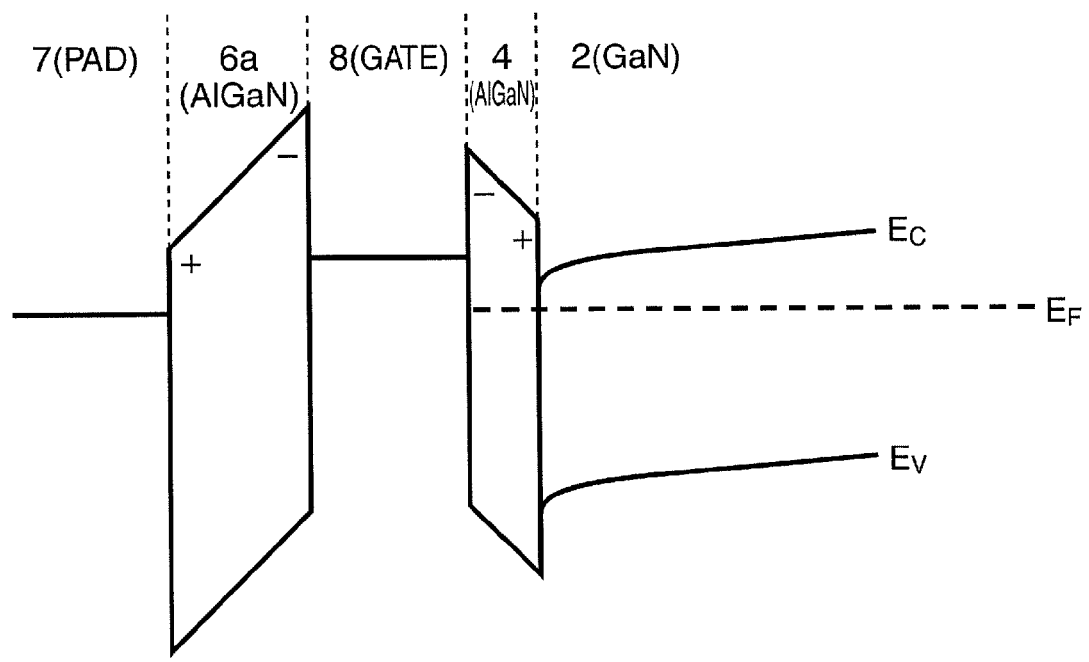
FIG. 7B is a view illustrating a band diagram of an AlGaN/GaN-HEMT according to the first embodiment.

FIG. 6A and FIG. 6B are schematic sectional views for describing the function and the effect of the AlGaN/GaN-HEMT according to the present embodiment, and are views corresponding to FIG. 2D. FIG. 5 is a schematic sectional view illustrating an AlGaN/GaN-HEMT of a comparative example. FIG. 7A is a view illustrating a band diagram of the AlGaN/GaN-HEMT according to the comparative example of the present embodiment, and FIG. 7B is a view illustrating a band diagram of the AlGaN/GaN-HEMT according to the present embodiment. For information, in FIG. 5, FIG. 6A and FIG. 6B, the illustration for the SiC substrate 1, the intermediate layer 3 and the cap layer 5 in FIG. 3A will be omitted, for the sake of simplifying the description.

In an ordinary AlGaN/GaN-HEMT, as is illustrated in FIG. 5, distortion occurs in the electron supply layer 4, which originates in the difference between the lattice constants of the electron transit layer 2 formed from GaN and the electron supply layer 4 formed from AlGaN, and piezo polarization is generated. In this case, as is illustrated in FIG. 7A, a Fermi energy $E_F$ becomes larger than a conduction band $E_C$ in the interface between the electron transit layer 2 and the electron supply layer 4, and a high concentration of two-dimensional electron gas is obtained. Thereby, high output is achieved. However, because of this high concentration of the two-dimensional electron gas, the threshold value of a gate voltage becomes a negative value, and a large amount of the two-dimensional electron gas exists in a channel region, even in an off state. Because of this, there is such a problem in the ordinary AlGaN/GaN-HEMT that it is difficult to realize the normally-off operation.

In the AlGaN/GaN-HEMT of the present embodiment, as is illustrated in FIG. 6A, a semiconductor which is a gate control layer 6a formed from AlGaN here, is arranged between the electron supply layer 4 and the gate electrode connection layer 8. The gate electrode connection layer 8 is conducted to the gate electrode 15 through wiring connection.

A gate pad connection layer 7 is arranged in the vicinity of the gate control layer 6a on the electron supply layer 4. The gate pad connection layer 7 is conducted to the gate pad 20 through wiring connection.

In the AlGaN/GaN-HEMT of the present embodiment, as is illustrated in FIG. 6A, a path P (in FIG. 6A, path indicated by five arrows) of a gate current is formed between the gate pad connection layer 7 (gate pad 20) and the gate electrode connection layer 8 (gate electrode 15). As is illustrated in FIG. 6B, the gate control layer 6a has properties of piezo polarization and spontaneous polarization. A voltage difference due to a negative offset is generated between the gate pad 20 and the gate electrode 15, which is caused by the piezo polarization and the spontaneous polarization of the gate control layer 6a. In this case, as is illustrated in FIG. 7B, an energy band of the gate electrode 15 is elevated by the gate control layer 6a. The Fermi energy $E_F$ is smaller than the conduction band $E_C$ in the interface between the electron transit layer 2 and the electron supply layer 4, and the two-dimensional electron gas is not generated in the channel region. These properties are used in the present embodiment, and as described above, the gate pad connection layer 7 and the gate electrode connection layer 8 are connected so that a potential always negative with respect to the gate pad 20 is applied to the gate electrode 15. Thereby, the threshold value of the gate voltage is shifted toward a positive direction. Accordingly, the potential of the gate electrode is controlled so as to become a desired positive potential when a drain current is in an off state, in other words, the threshold value of the gate voltage is controlled so as to become a desired positive value, and thereby a complete normally-off type of transistor is realized. A specific object to be controlled is a composition, a thickness and the like of the gate control layer 6a, as will be described later.

Here, the piezo polarization and the spontaneous polarization of the semiconductor will be described below, while taking a nitride semiconductor as an example. In the nitride semiconductor, a negative electric charge is generated in a (0001) face and a positive electric charge is generated in a (000-1) face due to the asymmetry of its atomic structure, even in such a state that distortion is not applied to the nitride semiconductor. This is the spontaneous polarization, and a strong internal electric field is generated along a c-axis by this electric charge.

In addition, when the distortion is applied to the crystal, the asymmetry of the atoms is increased, and the quantity of the electric charge to be generated is increased. This is piezo polarization, and in the case of the nitride semiconductor, the internal electric field is generated in the same direction as that of the spontaneous polarization, by tensile strain. The crystal of the nitride semiconductor is typically grown in the c-axis direction. Accordingly, when a hetero interface is formed, a biaxial stress is applied in a direction perpendicular to the c-axis. Piezo polarization Pz generated at this time is expressed by the following expression (1).

$$Pz = \{e_{31} - (C_{31}/C_{33})e_{33}\}\epsilon_\perp \quad (1)$$

Here, a piezo electric constant is represented by $e_{ij}$, an elastic constant is represented by $C_{ij}$, and an in-plane distortion is represented by $\epsilon_\perp$.

When a mixed crystal (AlGaN, InAlN, InGaN, InAlGaN and the like) of the nitride semiconductor (InN, GaN, AlN and the like) is prepared, the values of the piezo polarization and the spontaneous polarization become fixed values between the maximum values and the minimum values of the respective polarization values of these nitride semiconductors. The magnitude of the spontaneous polarization of the nitride semiconductor is illustrated in the following Table 1.

TABLE 1

| Semiconductor material | Spontaneous polarization (MV/cm) |
|---|---|
| InN | 2.5 |
| GaN | 3.1 |
| AlN | 8.5 |
| AlGaN | 3.1-8.5 |

As is illustrated in Table 1, in the AlGaN of the mixed crystal of the nitride semiconductor, the spontaneous polarization in a wide range of 3.1 to 8.5 (MV/cm) is obtained by changing the composition in a range of 0 (0%) to 1 (100%). In the present embodiment, by using these properties, the threshold value of the gate voltage can be controlled to become a desired positive value by the gate control layer which has been formed so as to have a predetermined polarization by controlling the composition and the thickness of the mixed crystal.

One example of the control for the threshold value of the gate voltage is illustrated in the following Table 2.

TABLE 2

| $Al_{0.2}Ga_{0.8}N/GaN$ | Polarization (MV/cm) | Potential difference (V) per 1 nm |
|---|---|---|
| Piezo polarization | 1.09 | 0.109 |
| Spontaneous polarization | 4.18 | 0.418 |
| Total | 5.27 | 0.527 |

It is recognized from the spontaneous polarization of Table 1 and the piezo polarization of the Expression (1) that in the gate control layer 6a which has been prepared according to the manufacturing method shown in the present embodiment, is formed from n-$Al_{0.2}Ga_{0.8}N$ and has a film thickness of approximately 5 nm, the potential difference between the upper and lower portions of the gate control layer 5 is approximately 2.6 V.

Figure 8:
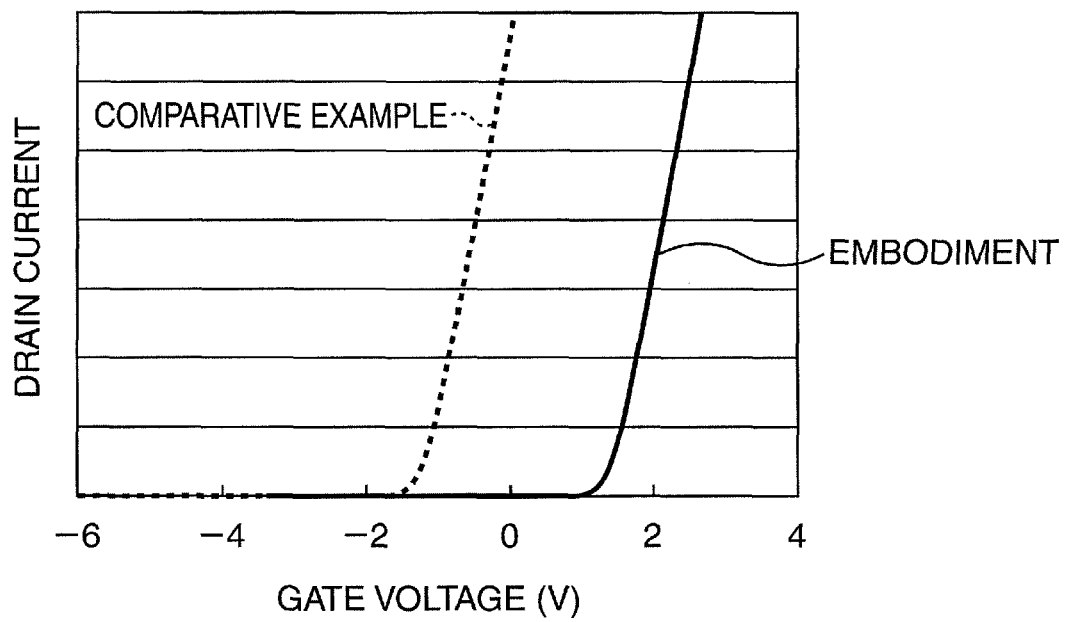
FIG. 8 is a characteristic diagram illustrating drain current-gate voltage characteristics in the AlGaN/GaN-HEMTs according to the first embodiment and the comparative example.

FIG. 8 is a characteristic diagram illustrating drain current-gate voltage characteristics in AlGaN/GaN-HEMTs according to the present embodiment and the comparative example.

In the comparative example illustrated in FIG. 5, the threshold value of the gate voltage is −1.7 V as is illustrated in a graph indicated by a dashed line of FIG. 8, and it is confirmed that the AlGaN/GaN-HEMT works in a normally-on operation. On the other hand, in the present embodiment, an offset of −2.6 V is applied to the gate voltage due to the existence of the gate control layer 5, as is illustrated by a graph of a solid line in FIG. 8. Thereby, the threshold value of the gate voltage is shifted toward a positive direction by approximately 2.6 V, and the threshold value of the gate voltage becomes a positive value of approximately +0.9 V. Thus, it is confirmed that the AlGaN/GaN-HEMT works in a normally-off operation.

As described above, according to the present embodiment, an AlGaN/GaN-HEMT is realized which can work in an intended normally-off operation without causing such inconveniences as increase in the sheet resistance, increase in the on-resistance and increase in the leakage current, with a relatively simple structure.

Modified Example

Figure 9:
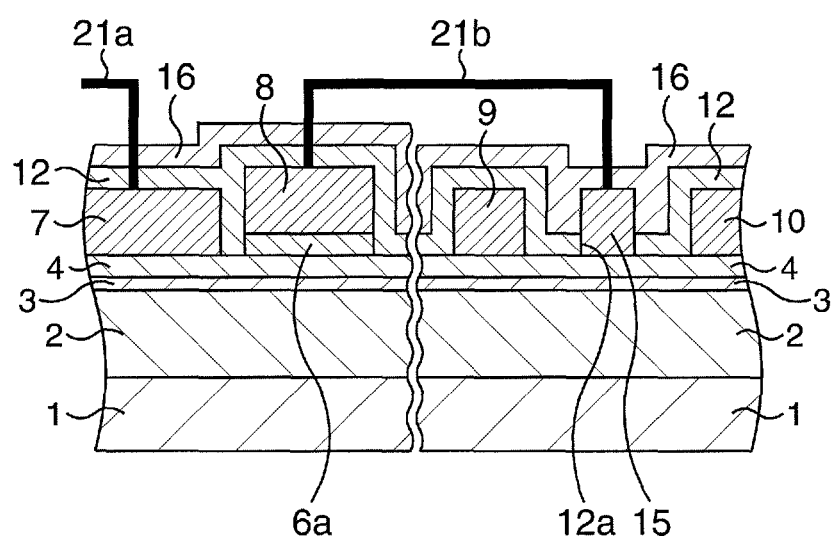
FIG. 9 is a schematic sectional view illustrating a compound semiconductor device of a modified example of the first embodiment.

FIG. 9 is a schematic sectional view illustrating a compound semiconductor device of a modified example of the first embodiment, and corresponds to FIG. 2J of the first embodiment.

In this modified example, a cap layer 5 in FIG. 2A is not formed. As a result, as is illustrated in FIG. 9, an AlGaN/GaN-HEMT of the modified example has a gate pad connection layer 7, a gate electrode connection layer 8 having an interposed gate control layer 6a, a source electrode 9, a drain electrode 10, a gate electrode 15 and the like, on an electron supply layer 4.

In this modified example as well, similarly to the first embodiment, the AlGaN/GaN-HEMT is realized which can work in an intended normally-off operation without causing such inconveniences as increase in the sheet resistance, increase in the on-resistance and increase in the leakage current, with a relatively simple structure.

Second Embodiment

In the present embodiment, a compound semiconductor device and a method for manufacturing the same are disclosed which are similar to those in the first embodiment, but are different from those in the first embodiment, in the point that the structure of the gate control layer is different. In addition, the same components as the component and the like of the AlGaN/GaN-HEMT in the first embodiment are denoted by the same reference numerals, and the detailed description will be omitted.

Figure 10A:
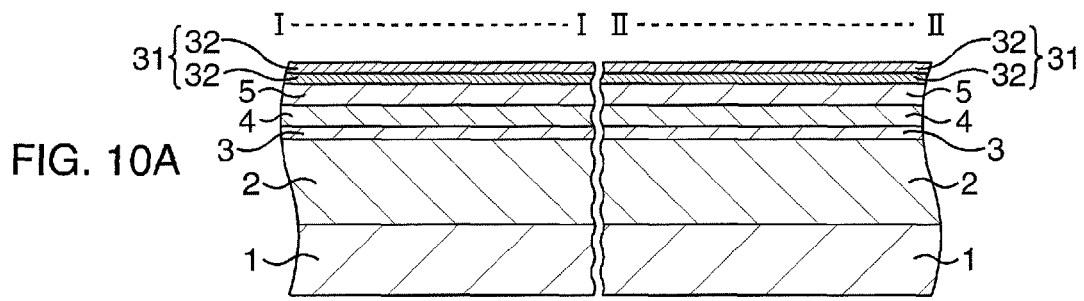
FIG. 10A is a schematic sectional view illustrating a principal step in a method for manufacturing a compound semiconductor device according to a second embodiment.
Figure 10B:
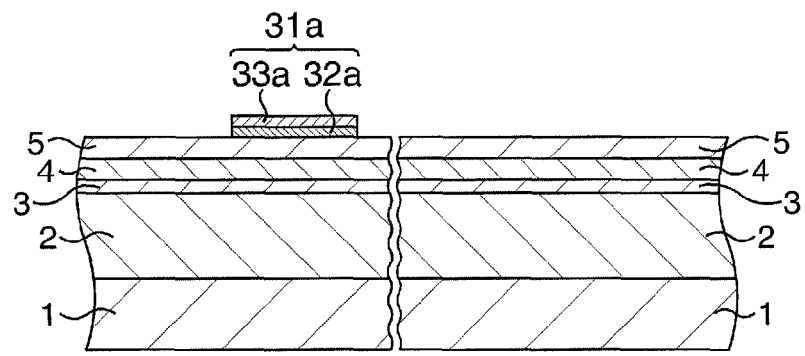
FIG. 10B is a schematic sectional view illustrating a principal step in the method for manufacturing the compound semiconductor device according to the second embodiment.
Figure 10C:
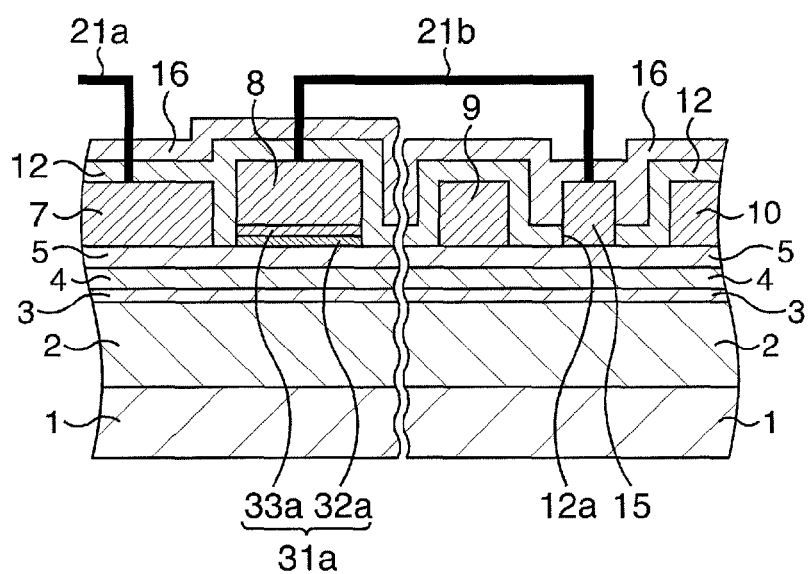
FIG. 10C is a schematic sectional view illustrating a principal step in the method for manufacturing the compound semiconductor device according to the second embodiment.

FIGS. 10A to 10C are schematic sectional views illustrating principal steps in the method for manufacturing the compound semiconductor device according to the second embodiment. The AlGaN/GaN-HEMT according to the second embodiment has a structure which is partially different from that of FIG. 1 of the first embodiment, but FIGS. 10A to 10C correspond to cross sections in positions along the dashed lines I-I and II-II in FIG. 1.

First, an electron transit layer 2, an intermediate layer 3, an electron supply layer 4, a cap layer 5 and a semiconductor layer 31 are sequentially formed on a SiC substrate 1, as is illustrated in FIG. 10A.

The semiconductor layer 31 is formed of a plurality of stacked compound semiconductor layers. Each of the compound semiconductor layers is formed from a semiconductor having properties of being piezoelectrically polarized which are referred to as a piezoelectric effect and being spontaneously polarized, for instance, from a hexagonal nitride semiconductor or a hexagonal oxide semiconductor, on the basis of the relationship between the semiconductor and the GaN of the electron transit layer 2. In the case of a nitride semiconductor, the semiconductor layer 31 is formed of a plurality of stacked semiconductors which have been selected from GaN, AlN and InN, for instance. In the case of an oxide semiconductor, the semiconductor layer 31 is formed of a plurality of stacked semiconductors which have been selected from ZnO and ZnMgO, for instance. In the present embodiment, the case is illustrated in which the semiconductor layer 31 is formed of an AlN layer 32 and a GaN layer 33 that are sequentially stacked.

Specifically in FIG. 10A, each of the following compound semiconductor layers is grown on the SiC substrate 1, for instance, with a metal organic vapor phase epitaxy (MOVPE) method, by using a crystal growth apparatus.

The electron transit layer 2, the intermediate layer 3, the electron supply layer 4, the cap layer 5, the AlN layer 32 and the GaN layer 33 are sequentially stacked and formed on the SiC substrate 1 respectively by the sequential depositions of i-GaN, i-AlGaN, n-AlGaN, n-GaN, intentionally undoped AlN (i-AlN) and n-GaN. Here, the electron transit layer 2 is formed so as to have a film thickness of approximately 2 μm. The intermediate layer 3 is formed so as to have a film thickness of approximately 5 nm and an Al ratio of 0.2, for instance. The electron supply layer 4 is formed so as to have a film thickness of approximately 30 nm and an Al ratio of 0.2, for instance. The cap layer 5 is formed so as to have a film thickness of approximately 10 nm. The AlN layer 32 is formed so as to have a film thickness of approximately 5 nm. The GaN layer 33 is formed so as to have a film thickness of approximately 5 nm.

As for the growing conditions of the i-GaN, the i-AlN, the i-AlGaN, the n-GaN and the n-AlGaN, a mixture gas of trimethylaluminum gas, trimethylgallium gas and ammonia gas is used as a source gas, and the presence or absence of the supply of the trimethylaluminum gas which is a source of Al and the trimethylgallium gas which is a source of Ga and the flow rate of each gas are appropriately set according to the types of growing compound semiconductor layers. The flow rate of the ammonia gas which is a common raw material is set at approximately 100 ccm to 10 LM. In addition, the growth pressure is set at approximately 50 Torr to 300 Torr, and the growth temperature is set at approximately 1,000° C. to 1,200° C. When the n-GaN and the n-AlGaN are grown, $SiH_4$ gas, for instance, containing Si, for instance, as n-type impurities is added to the source gas at a predetermined flow rate to dope the GaN and the AlGaN with Si. The doping concentration by Si is set in a range of $1\times10^{18}/cm^3$ to $1\times10^{20}/cm^3$, and approximately at $1\times10^{18}/cm^3$, for instance.

Subsequently, the semiconductor layer 31 is patterned and a gate control layer 31a is formed as is illustrated in FIG. 10B.

Specifically, First, the GaN layer 33 and the AlN layer 32 are processed by lithography and dry etching, and are left only at a site at which a gate electrode connection layer is formed. Thereby, the gate control layer 31a is formed in which the AlN layer 32a and the GaN layer 33a are stacked. The resist used for the lithography is removed by ashing or the like.

Subsequently, the steps similar to those in FIGS. 2C to 2J of the first embodiment are conducted. In the step corresponding to FIG. 2J, the gate electrode connection layer 8 and the gate electrode 15, and the gate pad connection layer 7 and a gate pad which will be described later are connected with each other by wires, respectively as is illustrated in FIG. 10C. After that, the AlGaN/GaN-HEMT of the present embodiment is formed through the similar steps to those of FIGS. 3A to 3C, FIG. 4 and the like.

As described above, according to the present embodiment, an AlGaN/GaN-HEMT is realized which can work in an intended normally-off operation without causing such inconveniences as increase in the sheet resistance, increase in the on-resistance and increase in the leakage current, with a relatively simple structure.

Modified Example

Figure 11:
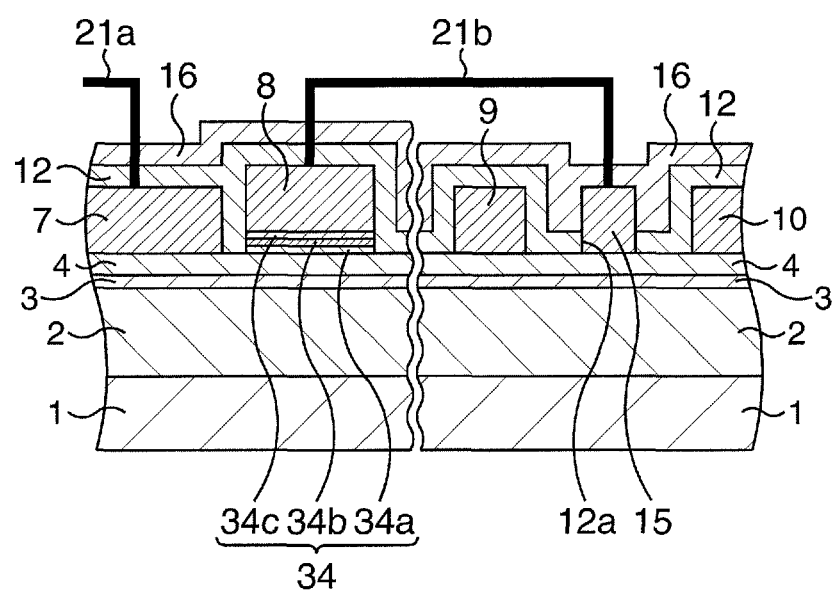
FIG. 11 is a schematic sectional view illustrating a compound semiconductor device of a modified example of the second embodiment.

FIG. 11 is a schematic sectional view illustrating a compound semiconductor device of a modified example of the second embodiment, and corresponds to FIG. 10C of the second embodiment.

In this modified example, a cap layer 5 in FIG. 10A is not formed. As a result, as is illustrated in FIG. 11, an AlGaN/GaN-HEMT of the modified example has a gate pad connection layer 7, a gate electrode connection layer 8 having an interposed gate control layer 34, a source electrode 9, a drain electrode 10, a gate electrode 15 and the like on an electron supply layer 4.

The gate control layer 34 is formed of a GaN layer 34a, an AlN layer 34b and a GaN layer 34c which are sequentially stacked. The GaN layer 34a corresponds to the cap layer 5 under the AlN layer 31b in the first embodiment. The AlN layer 34b and the GaN layer 34c correspond to the AlN layer 32b and the GaN layer 31b in the second embodiment. The GaN layer 34a, the AlN layer 34b and the GaN layer 34c are formed from n-GaN, i-AlN and n-GaN, respectively.

In this modified example as well, similarly to the second embodiment, an AlGaN/GaN-HEMT is realized which can work in an intended normally-off operation without causing such inconveniences as increase in the sheet resistance, increase in the on-resistance and increase in the leakage current, with a relatively simple structure.

Third Embodiment

In the present embodiment, a compound semiconductor device and a method for manufacturing the same are disclosed which are similar to those in the first embodiment, but are different from those in the first embodiment, in the point that the structure in the periphery of the gate electrode is different. In addition, the same components as the component and the like of the AlGaN/GaN-HEMT in the first embodiment are denoted by the same reference numerals, and the detailed description will be omitted.

FIGS. 12A to 12D are schematic sectional views illustrating principal steps in the method for manufacturing the compound semiconductor device according to the third embodiment. The AlGaN/GaN-HEMT according to the third embodiment has a structure which is partially different from that of FIG. 1 of the first embodiment, but FIGS. 12A to 12D correspond to cross sections in positions along the dashed lines I-I and II-II in FIG. 1.

First, the step similar to that in FIG. 2A of the first embodiment is conducted.

Figure 12A:
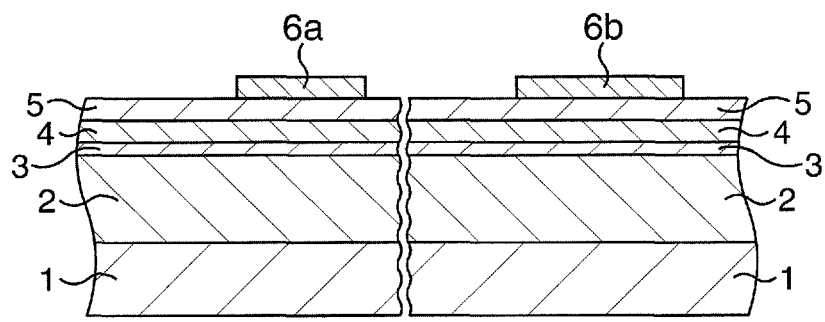
FIG. 12A is a schematic sectional view illustrating a principal step in a method for manufacturing a compound semiconductor device according to a third embodiment.

Subsequently, a semiconductor layer 6 is patterned, and a gate control layer 6a and a buried layer 6b are formed as is illustrated in FIG. 12A.

Specifically, the semiconductor layer 6 is processed by lithography and dry etching. The semiconductor layer 6 is left at a site at which a gate electrode connection layer is formed, and at a site between a site at which a source electrode is formed and a site at which a drain electrode is formed. Thereby, the gate control layer 6a is formed at the site at which the gate electrode connection layer is formed, and the buried layer 6b is formed at the site between the site at which the source electrode is formed and the site at which the drain electrode is formed, respectively. The resist used for the lithography is removed by ashing or the like.

Subsequently, the steps similar to those of FIGS. 2C to 2F of the first embodiment are conducted.

Figure 12B:
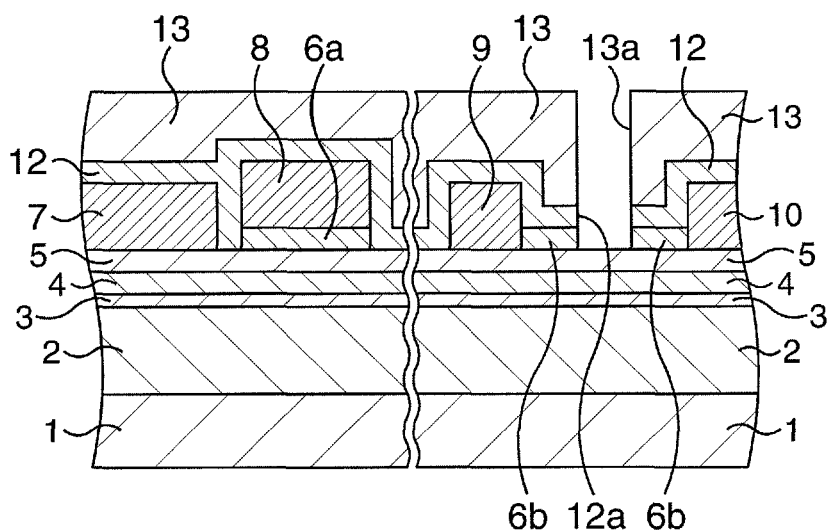
FIG. 12B is a schematic sectional view illustrating a principal step in the method for manufacturing the compound semiconductor device according to the third embodiment.

Subsequently, a passivation film 12 and the buried layer 6b are processed as is illustrated in FIG. 12B.

Specifically, the passivation film 12 is processed with the dry etching while using the resist mask 13 as the mask, and the passivation film 12 and the buried layer 6b at the site to be exposed to the outside from the aperture 13a are removed. Thereby, the aperture 12a that exposes the site at which a gate electrode is formed to the outside is formed in the passivation film 12, and the buried layer 6b is divided into right and left of the aperture 12a.

Figure 12C:
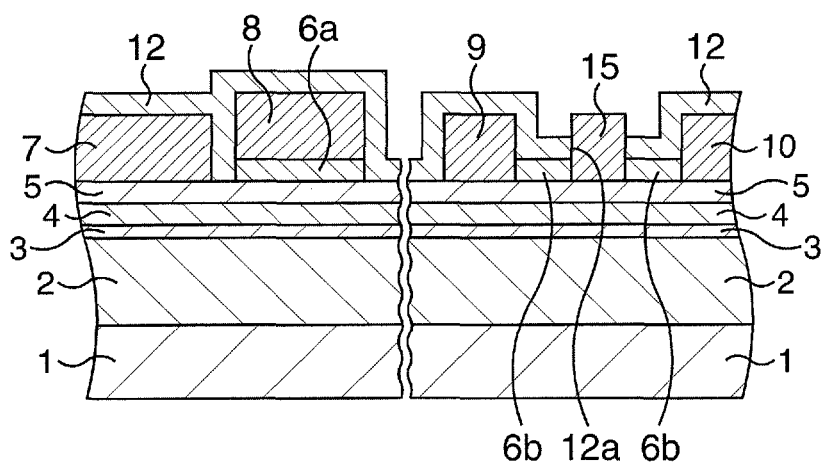
FIG. 12C is a schematic sectional view illustrating a principal step in the method for manufacturing the compound semiconductor device according to the third embodiment.

Subsequently, a gate electrode 15 is formed as is illustrated in FIG. 12C.

Specifically, Ni/Au, for instance, is used as the electrode material and is deposited on the resist mask 13 which is similar to that in FIG. 2F of the first embodiment so as to be embedded in the aperture 13a, with a vapor deposition method or the like. The resist mask 13 and Ni/Au having deposited on the resist mask 13 are removed with the lift-off method. By the above operations, the gate electrode 15 is formed on the cap layer 5 so as to be embedded in the aperture 12a of the passivation film 12. Thus formed gate electrode 15 forms such a state that the buried layer 6b is embedded between the source electrode 9 and the gate electrode 15, and between the drain electrode 10 and the gate electrode 15, respectively.

Figure 12D:
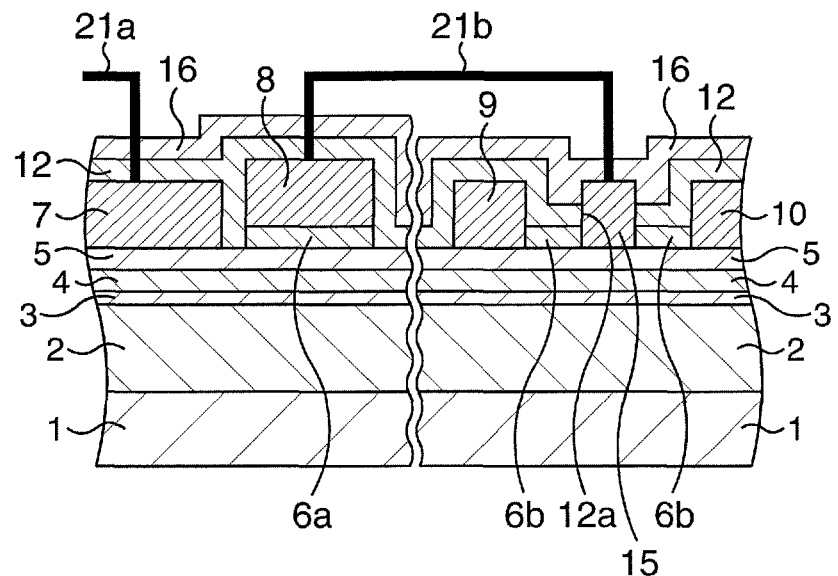
FIG. 12D is a schematic sectional view illustrating a principal step in the method for manufacturing the compound semiconductor device according to the third embodiment.

Subsequently, the steps similar to those of FIG. 2I and FIG. 2J of the first embodiment are conducted. In the step corresponding to FIG. 2J, the gate electrode connection layer 8 and the gate electrode 15, and the gate pad connection layer 7 and the gate pad which will be described later are connected with each other by wires, respectively as is illustrated in FIG. 12D. After that, the AlGaN/GaN-HEMT of the present embodiment is formed through the similar steps to those of FIGS. 3A to 3C, FIG. 4 and the like.

As described above, according to the present embodiment, an AlGaN/GaN-HEMT is realized which can work in an intended normally-off operation without causing such inconveniences as increase in the sheet resistance, increase in the on-resistance and increase in the leakage current, with a relatively simple structure.

Furthermore, energy bands between the source electrode 9 and the gate electrode 15, and between the drain electrode 10 and the gate electrode 15, are depressed by thus provided buried layer 6b, and more two-dimensional electron gas is generated. Thereby, the on-resistance is further reduced.

Modified Example

Figure 13:
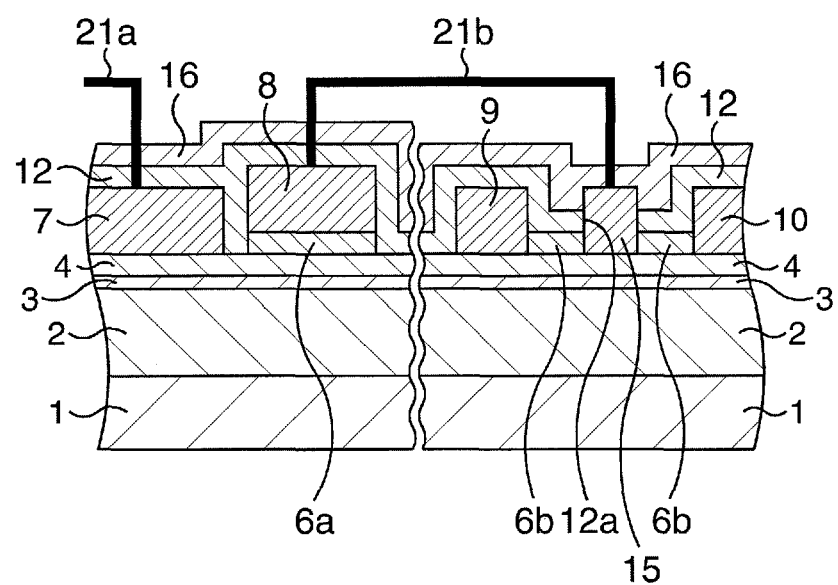
FIG. 13 is a schematic sectional view illustrating a compound semiconductor device of a modified example of the third embodiment.

FIG. 13 is a schematic sectional view illustrating a compound semiconductor device of a modified example of the third embodiment, and corresponds to FIG. 12D of the third embodiment.

In this modified example, a cap layer 5 in FIG. 2A is not formed. As a result, as is illustrated in FIG. 9, an AlGaN/GaN-HEMT of the modified example has a gate pad connection layer 7, a gate electrode connection layer 8 having an interposed gate control layer 6a, a source electrode 9, a drain electrode 10, a gate electrode 15, a buried layer 6b and the like, on an electron supply layer 4.

In this modified example as well, similarly to the third embodiment, an AlGaN/GaN-HEMT is realized which can work in an intended normally-off operation without causing such inconveniences as increase in the sheet resistance, increase in the on-resistance and increase in the leakage current, with a relatively simple structure.

Furthermore, energy bands between the source electrode 9 and the gate electrode 15, and between the drain electrode 10 and the gate electrode 15, are depressed by thus provided buried layer 6b, and more two-dimensional electron gas is generated. Thereby, the on-resistance is further reduced.

Fourth Embodiment

In the present embodiment, a compound semiconductor device and a method for manufacturing the same are disclosed which are similar to those in the first embodiment, but are different from those in the first embodiment, in the point that the structures of the gate control layer and the periphery are different. In addition, the same components as the component and the like of the AlGaN/GaN-HEMT in the first to third embodiments are denoted by the same reference numerals, and the detailed description will be omitted.

FIGS. 14A to 14E are schematic sectional views illustrating principal steps in the method for manufacturing the compound semiconductor device according to the fourth embodiment. The AlGaN/GaN-HEMT according to the fourth embodiment has a structure which is partially different from that of FIG. 1 of the first embodiment, but FIGS. 14A to 14E correspond to cross sections in positions along the dashed lines I-I and II-II in FIG. 1.

Figure 14A:
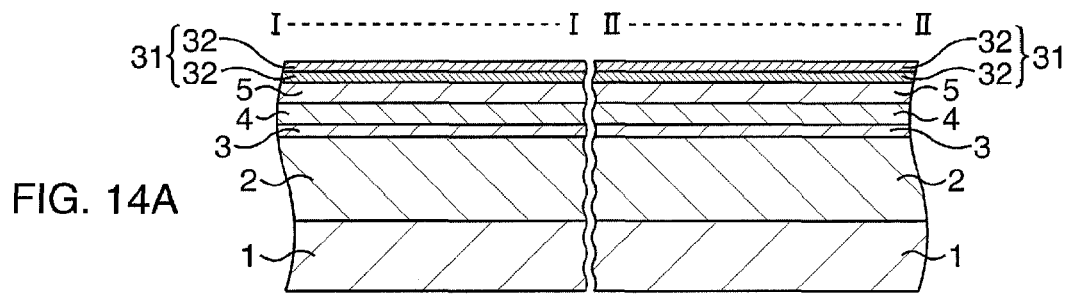
FIG. 14A is a schematic sectional view illustrating a principal step in a method for manufacturing a compound semiconductor device according to a fourth embodiment.

First, the step similar to that of FIG. 10A of the second embodiment is conducted, and an electron transit layer 2, an intermediate layer 3, an electron supply layer 4, a cap layer 5 and a semiconductor layer 31 are sequentially formed on an SiC substrate 1, as is illustrated in FIG. 14A.

Figure 14B:
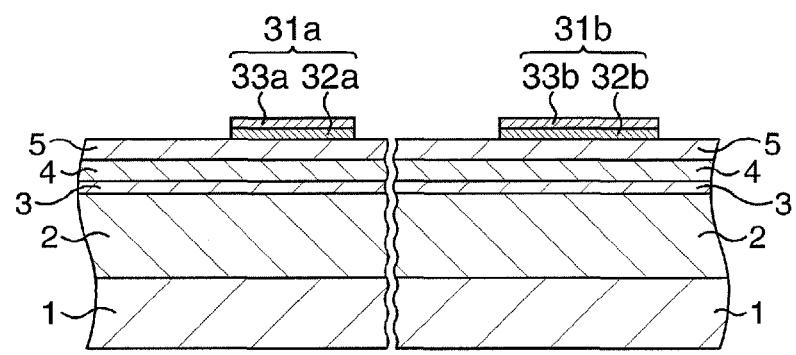
FIG. 14B is a schematic sectional view illustrating a principal step in the method for manufacturing the compound semiconductor device according to the fourth embodiment.

Subsequently, as is illustrated in FIG. 14B, the semiconductor layer 31 is patterned, and a gate control layer 31a and a buried layer 31b are formed.

Specifically, a GaN layer 33 and an AlN layer 32 are processed by lithography and dry etching. A stacked film of the GaN layer 33 and the AlN layer 32 is left at a site at which a gate electrode connection layer is formed, and at a site between a site at which a source electrode is formed and a site at which a drain electrode is formed. Thereby, the gate control layer 31a in which the AlN layer 32a and the GaN layer 33a are stacked is formed at the site at which the gate electrode connection layer is formed. The buried layer 31b in which the AlN layer 32b and the GaN layer 33b are stacked is formed at the site between the site at which the source electrode is formed and the site at which the drain electrode is formed. The resist used for the lithography is removed by ashing or the like.

Subsequently, the steps similar to those of FIGS. 2C to 2F of the first embodiment are conducted.

Figure 14C:
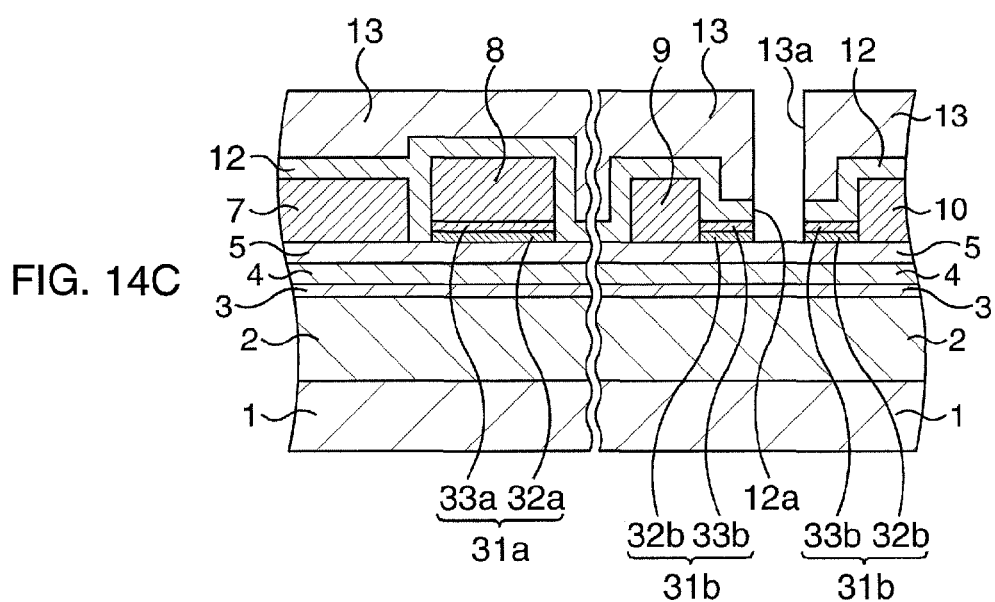
FIG. 14C is a schematic sectional view illustrating a principal step in the method for manufacturing the compound semiconductor device according to the fourth embodiment.

Subsequently, a passivation film 12 and the buried layer 31b are processed as is illustrated in FIG. 14C.

Specifically, the passivation film 12 is processed with the dry etching while using the resist mask 13 as the mask, and the passivation film 12 and the buried layer 31b at the site to be exposed to the outside from the aperture 13a are removed. Thereby, the aperture 12a that exposes the site at which the gate electrode is formed to the outside is formed in the passivation film 12, and the buried layer 31b is divided into right to left of the aperture 12a.

Figure 14D:
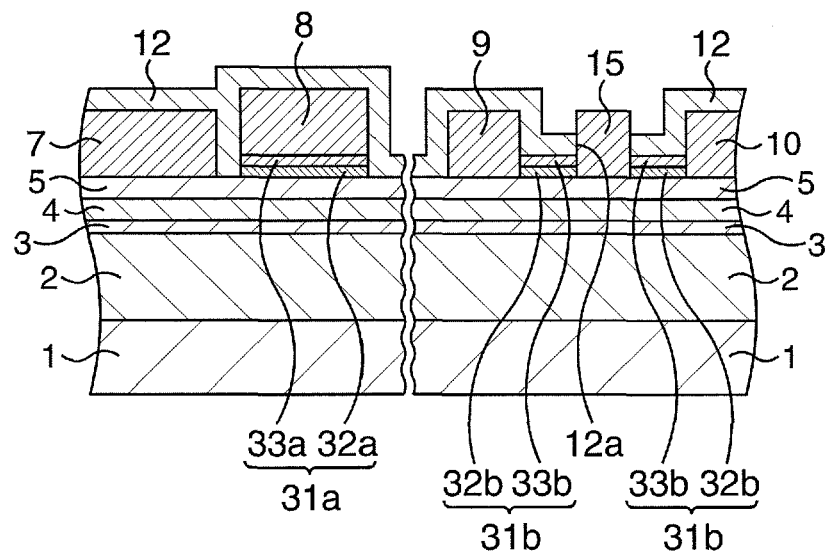
FIG. 14D is a schematic sectional view illustrating a principal step in the method for manufacturing the compound semiconductor device according to the fourth embodiment.

Subsequently, the gate electrode 15 is formed as is illustrated in FIG. 14D.

Specifically, Ni/Au, for instance, is used as the electrode material and is deposited on the resist mask 13 so as to be embedded in the aperture 13a, with a vapor deposition method or the like. The resist mask 13 and Ni/Au having deposited on the resist mask 13 are removed with the lift-off method. By the above operations, the gate electrode 15 is formed on the cap layer 5 so as to be embedded in the aperture 12a of the passivation film 12. Thus formed gate electrode 15 forms such a state that the buried layer 31b is embedded between the source electrode 9 and the gate electrode 15, and between the drain electrode 10 and the gate electrode 15, respectively.

Figure 14E:
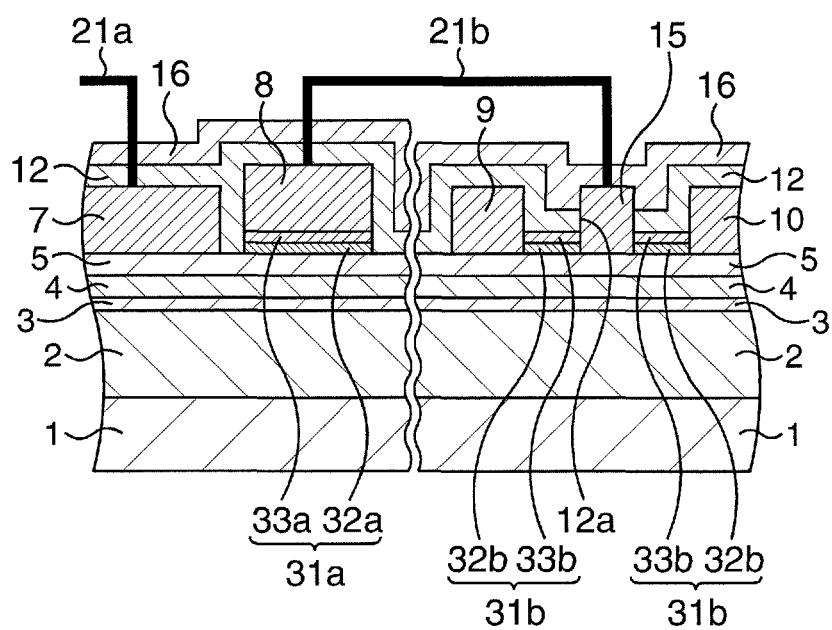
FIG. 14E is a schematic sectional view illustrating a principal step in the method for manufacturing the compound semiconductor device according to the fourth embodiment.

Subsequently, the steps similar to those of FIG. 2I and FIG. 2J of the first embodiment are conducted. In the step corresponding to FIG. 2J, the gate electrode connection layer 8 and the gate electrode 15, and the gate pad connection layer 7 and a gate pad which will be described later are connected with each other by wires, respectively as is illustrated in FIG. 14E. After that, the AlGaN/GaN-HEMT of the present embodiment is formed through the similar steps to those of FIGS. 3A to 3C, FIG. 4 and the like.

As described above, an AlGaN/GaN-HEMT is realized which can work in an intended normally-off operation without causing such inconveniences as increase in the sheet resistance, increase in the on-resistance and increase in the leakage current, with a relatively simple structure.

Furthermore, energy bands between the source electrode 9 and the gate electrode 15, and between the drain electrode 10 and the gate electrode 15 are depressed by thus provided buried layer 31b, and more two-dimensional electron gas is generated. Thereby, the on-resistance is further reduced.

Modified Example

Figure 15:
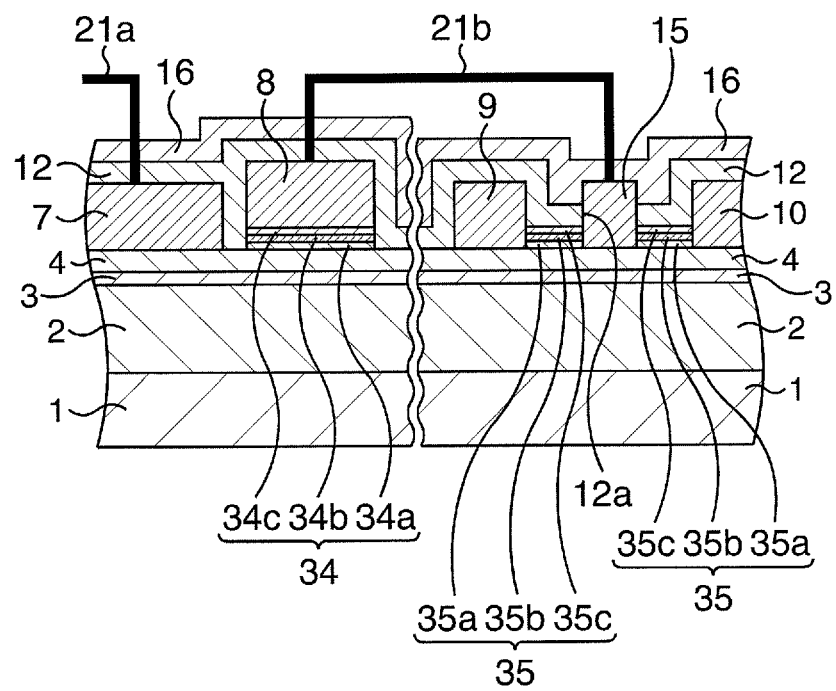
FIG. 15 is a schematic sectional view illustrating a compound semiconductor device of a modified example of the fourth embodiment.

FIG. 15 is a schematic sectional view illustrating a compound semiconductor device of a modified example of the fourth embodiment, and corresponds to FIG. 14E of the fourth embodiment.

In this modified example, a cap layer 5 in FIG. 2A is not formed. As a result, as is illustrated in FIG. 15, an AlGaN/GaN-HEMT of the modified example has a gate pad connection layer 7, a gate electrode connection layer 8 having an interposed gate control layer 34, a source electrode 9, a drain electrode 10, a gate electrode 15, a buried layer 35 and the like on an electron supply layer 4.

The gate control layer 34 is formed of a GaN layer 34a, an AlN layer 34b and a GaN layer 34c which are sequentially stacked, in a similar way to that in FIG. 11 of the modified example of the second embodiment.

The buried layer 35 is formed of a GaN layer 35a, an AlN layer 35b and a GaN layer 35c which are sequentially stacked. The GaN layer 35a corresponds to the cap layer 5 under the AlN layer 31b in the fourth embodiment. The AlN layer 35b and the GaN layer 35c correspond to the AlN layer 31a and the GaN layer 31b in the fourth embodiment. The GaN layer 35a, the AlN layer 35b and the GaN layer 35c are respectively formed from n-GaN, i-AlN and n-GaN, similarly to the GaN layer 34a, the AlN layer 34b and the GaN layer 34c.

In this modified example as well, similarly to the fourth embodiment, an AlGaN/GaN-HEMT is realized which can work in an intended normally-off operation without causing such inconveniences as increase in the sheet resistance, increase in the on-resistance and increase in the leakage current, with a relatively simple structure.

Furthermore, energy bands between the source electrode 9 and the gate electrode 15, and between the drain electrode 10 and the gate electrode 15 are depressed by thus provided buried layer 35, and more two-dimensional electron gas is generated. Thereby, the on-resistance is further reduced.

Fifth Embodiment

In the present embodiment, a compound semiconductor device and a method for manufacturing the same are disclosed which are similar to those in the first embodiment, but are different from those in the first embodiment, in the point that the structures of an electron supply layer and a gate control layer are different. In addition, the same components as the component and the like of the AlGaN/GaN-HEMT in the first embodiment are denoted by the same reference numerals, and the detailed description will be omitted.

FIGS. 16A to 16E are schematic sectional views illustrating principal steps in the method for manufacturing the compound semiconductor device according to the fifth embodiment. The AlGaN/GaN-HEMT according to the fifth embodiment has a structure which is partially different from that of FIG. 1 of the first embodiment, but FIGS. 16A to 16E correspond to cross sections in positions along the dashed lines I-I and II-II in FIG. 1.

Figure 16A:
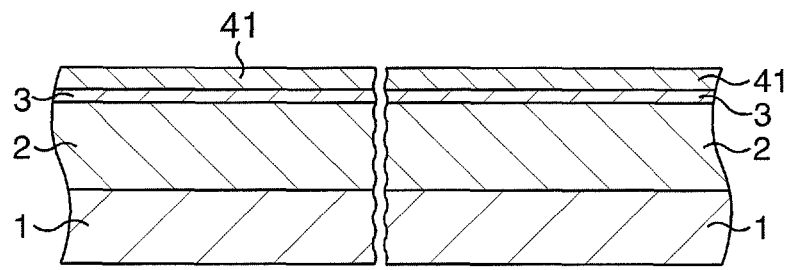
FIG. 16A is a schematic sectional view illustrating a principal step in a method for manufacturing a compound semiconductor device according to a fifth embodiment.

First, an electron transit layer 2, an intermediate layer 3 and an electron supply layer 41 are sequentially formed on an SiC substrate 1, as is illustrated in FIG. 16A.

In the present embodiment, a structure is adopted in which a part of the electron supply layer 41 serves as the gate control layer, as will be described later. The electron supply layer needs to be made from a semiconductor which has a lattice constant different from that of the electron transit layer 2 (intermediate layer 3). The gate control layer needs to be made from a semiconductor having properties of being piezoelectrically polarized and being spontaneously polarized. AlGaN, for instance, is preferable for the material of the electron supply layer 41, as a material which has both a property necessary for this electron supply layer and a property necessary for this gate control layer. In the present embodiment, n-AlGaN is used as the electron supply layer 41 similarly to the electron supply layer 4 of the first embodiment, and has a film thickness of approximately 20 nm and an Al ratio of 0.2 (20%), for instance.

Figure 16B:
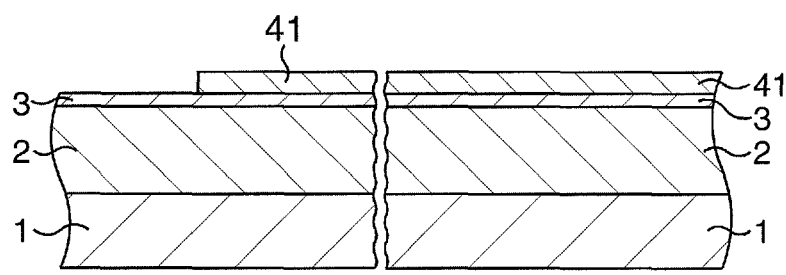
FIG. 16B is a schematic sectional view illustrating a principal step in the method for manufacturing the compound semiconductor device according to the fifth embodiment.

Subsequently, the electron supply layer 41 is patterned as is illustrated in FIG. 16B.

Specifically, the electron supply layer 41 is processed with lithography and dry etching, and the electron supply layer 41 at a site corresponding to a region of a gate pad connection layer to be formed is removed. At thus removed site, a part of the surface of the intermediate layer 3 is exposed to the outside.

Figure 16C:
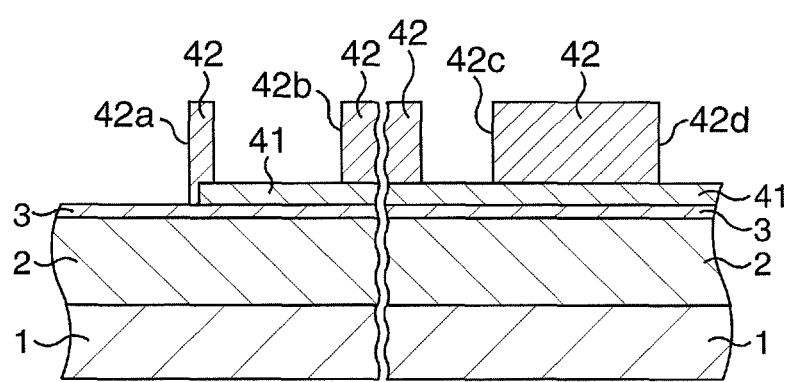
FIG. 16C is a schematic sectional view illustrating a principal step in the method for manufacturing the compound semiconductor device according to the fifth embodiment.

Subsequently, a resist mask 42 is formed as is illustrated in FIG. 16C.

Specifically, a resist is applied onto the SiC substrate 1, and the resist is processed with lithography. Thereby, the resist mask 42 is formed which has apertures 42a, 42b, 42c and 42d therein. The aperture 42a is formed so that a site of the gate pad connection layer to be formed is exposed to the outside on the surface of the intermediate layer 3. The aperture 42b is formed so that a site of the gate electrode connection layer to be formed is exposed to the outside on the surface of the electron supply layer 41. The aperture 42c is formed so that a site of the source electrode to be formed is exposed to the outside on the surface of the electron supply layer 41. The aperture 42d is formed so that a site of the drain electrode to be formed is exposed to the outside on the surface of the electron supply layer 41.

Figure 16D:
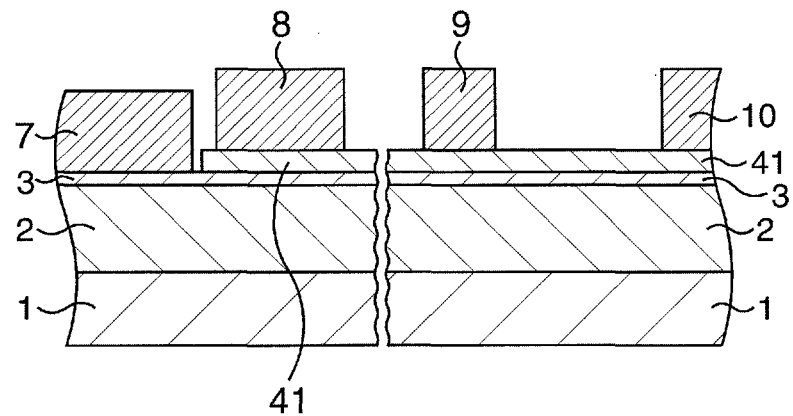
FIG. 16D is a schematic sectional view illustrating a principal step in the method for manufacturing the compound semiconductor device according to the fifth embodiment.

Subsequently, the gate pad connection layer 7, the gate electrode connection layer 8, the source electrode 9 and the drain electrode 10 are formed as is illustrated in FIG. 16D.

Specifically, Ti/Al, for instance, is used as the electrode material and is deposited on the resist mask 42 so as to be embedded in the apertures 42a, 42b, 42c and 42d, with a vapor deposition method or the like. The resist mask 42 and Ti/Al having deposited on the resist mask are removed with a lift-off method. After that, the SiC substrate 1 is heat-treated, for instance, in a nitrogen atmosphere at approximately 600° C., and an ohmic contact is established. By the above described operations, the gate pad connection layer 7 is formed on the intermediate layer 3. The gate electrode connection layer 8, the source electrode 9 and the drain electrode 10 are formed on the electron supply layer 41. Here, clearance between the gate pad connection layer 7 and the gate electrode connection layer 8 (electron supply layer 41) is set, for instance, at approximately 1 μm so that a current path is formed between the gate pad connection layer 7 and the gate electrode connection layer 8.

Figure 16E:
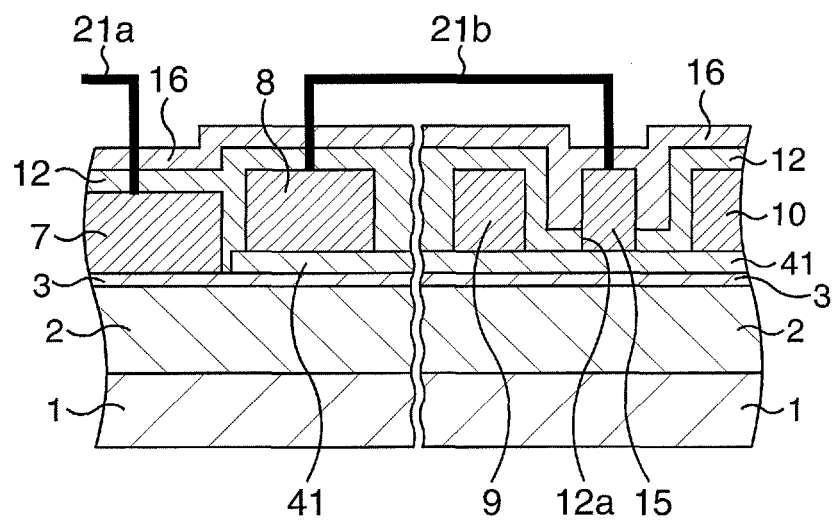
FIG. 16E is a schematic sectional view illustrating a principal step in the method for manufacturing the compound semiconductor device according to the fifth embodiment.

Subsequently, the steps similar to those of FIGS. 2E to 2J in the first embodiment are conducted. In the step corresponding to FIG. 2J, the gate electrode connection layer 8 and a gate electrode 15, and the gate pad connection layer 7 and a gate pad which will be described later are connected with each other by wires, respectively, as is illustrated in FIG. 16E. After that, the AlGaN/GaN-HEMT of the present embodiment is formed through the similar steps to those of FIGS. 3A to 3C, FIG. 4 and the like.

In the AlGaN/GaN-HEMT according to the present embodiment, the gate pad connection layer 7 is formed on the intermediate layer 3, and the gate electrode connection layer 8 is formed on the electron supply layer 41. In this structure, a site located under the gate electrode connection layer 8 out of the electron supply layer 41 serves as the gate control layer. In this AlGaN/GaN-HEMT, a path of a gate current is formed between the gate pad 20 (gate pad connection layer 7) and the gate electrode 15 (gate pad connection layer 7). The electron supply layer 41 has properties of piezo polarization and spontaneous polarization. A voltage difference due to a negative offset is generated between the gate pad 20 and the gate electrode 15, which is caused by the piezo polarization and spontaneous polarization of the electron supply layer 41. In this case, the electron supply layer 41 serves as the gate control layer, and an energy band of the gate electrode 15 is elevated. In an interface between the electron transit layer 2 and the electron supply layer 41 (intermediate layer 3), Fermi energy $E_F$ is smaller than a conduction band $E_C$, and a two-dimensional electron gas is not generated in the channel region. These properties are used in the present embodiment, and as described above, the gate pad connection layer 7 and the gate electrode connection layer 8 are connected so that a potential always negative with respect to the gate pad 20 is applied to the gate electrode 15. Thereby, the threshold value of the gate voltage is shifted toward a positive direction. Accordingly, if the threshold value of the gate voltage is controlled so that the potential of the gate electrode becomes a desired positive value when a drain current is in an off state, a complete normally-off type of transistor is realized.

As described above, according to the present embodiment, an AlGaN/GaN-HEMT is realized which can work in an intended normally-off operation without causing such inconveniences as increase in the sheet resistance, increase in the on-resistance and increase in the leakage current, with a relatively simple structure.

Incidentally, a technical idea of the third embodiment is considered to be applied to the present embodiment as well. For instance, a semiconductor layer of n-AlGaN or the like may be formed so as to be embedded between the source electrode 9 and the gate electrode 15 and between the drain electrode 10 and the gate electrode 15. Thereby, energy bands between the source electrode 9 and the gate electrode 15 and between the drain electrode 10 and the gate electrode 15 are depressed, more two-dimensional electron gas is generated, and the on-resistance is further reduced.

Sixth Embodiment

In the present embodiment, a power-supply unit is disclosed which is provided with an AlGaN/GaN-HEMT according to any of the first to fifth embodiments.

Figure 17:
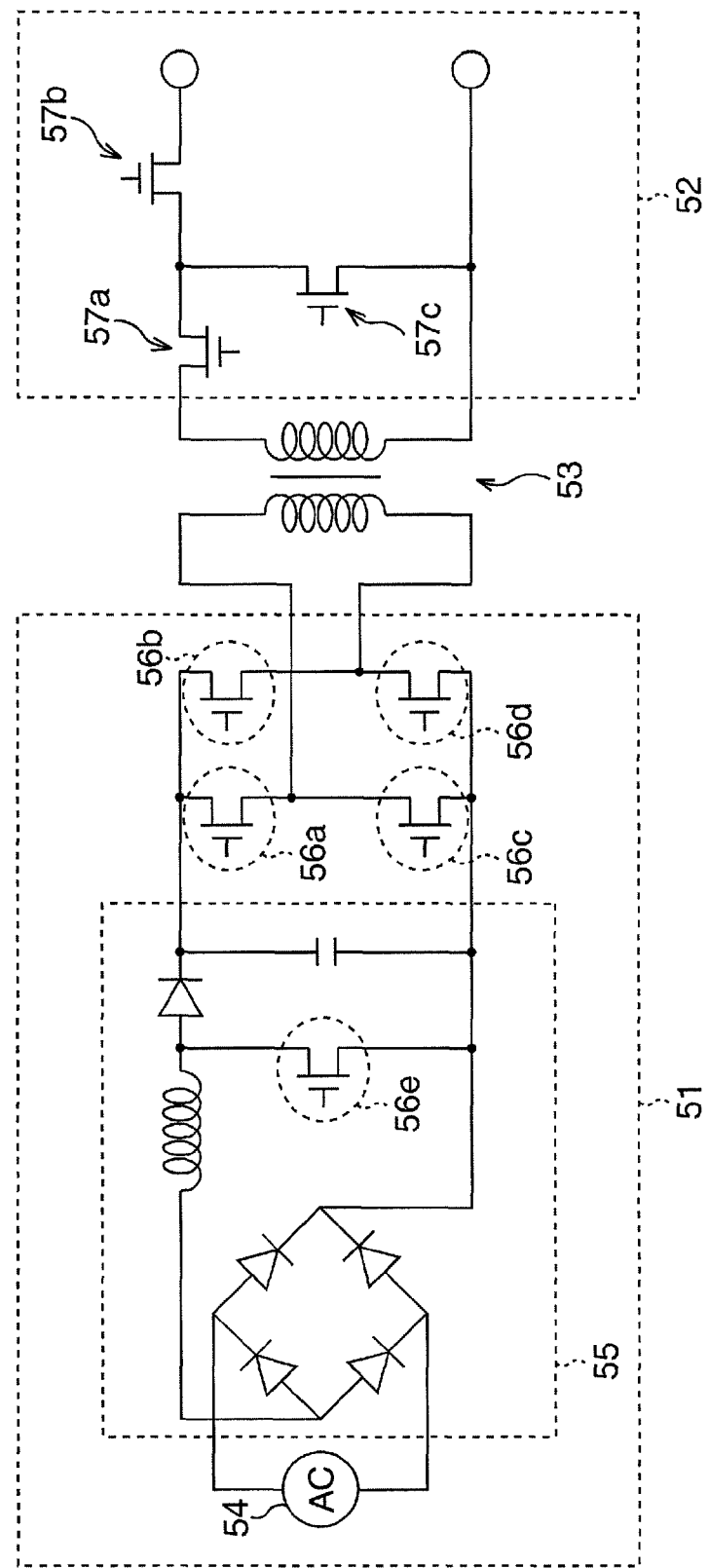
FIG. 17 is a connection wiring diagram illustrating a schematic structure of a power-supply unit according to a six embodiment.

FIG. 17 is a connection wiring diagram illustrating a schematic structure of the power-supply unit according to the sixth embodiment.

The power-supply unit according to the present embodiment is constituted by a high-voltage circuit 51 in a primary side, a low-voltage circuit 52 in a secondary side, and a transformer 53 arranged between the circuit 51 in the primary side and the circuit 52 in the secondary side.

The circuit 51 in the primary side is constituted by an AC power supply 54, so-called a bridge rectifier circuit 55 and a plurality (here, four) of switching elements 56a, 56b, 56c and 56d. In addition, the bridge rectifier circuit 55 has a switching element 56e.

The circuit 52 in the secondary side is constituted by a plurality (here, three) of switching elements 57a, 57b and 57c.

In the present embodiment, the switching elements 56a, 56b, 56c, 56d and 56e of the circuit 51 in the primary side shall be an AlGaN/GaN-HEMT according to any of the first to fifth embodiments. On the other hand, the switching elements 57a, 57b and 57c in the circuit 52 in the secondary side shall be an ordinary MIS-FET using silicon.

In the present embodiment, the AlGaN/GaN-HEMT is applied to the high-voltage circuit, which can work in an intended normally-off operation without causing such inconveniences as increase in the sheet resistance, increase in the on-resistance and increase in the leakage current. Thereby, a power-supply circuit with high reliability and a large electric power is realized.

Seventh Embodiment

In the present embodiment, a high-frequency amplifier will be disclosed which is provided with an AlGaN/GaN-HEMT according to any of the first to fifth embodiments.

Figure 18:
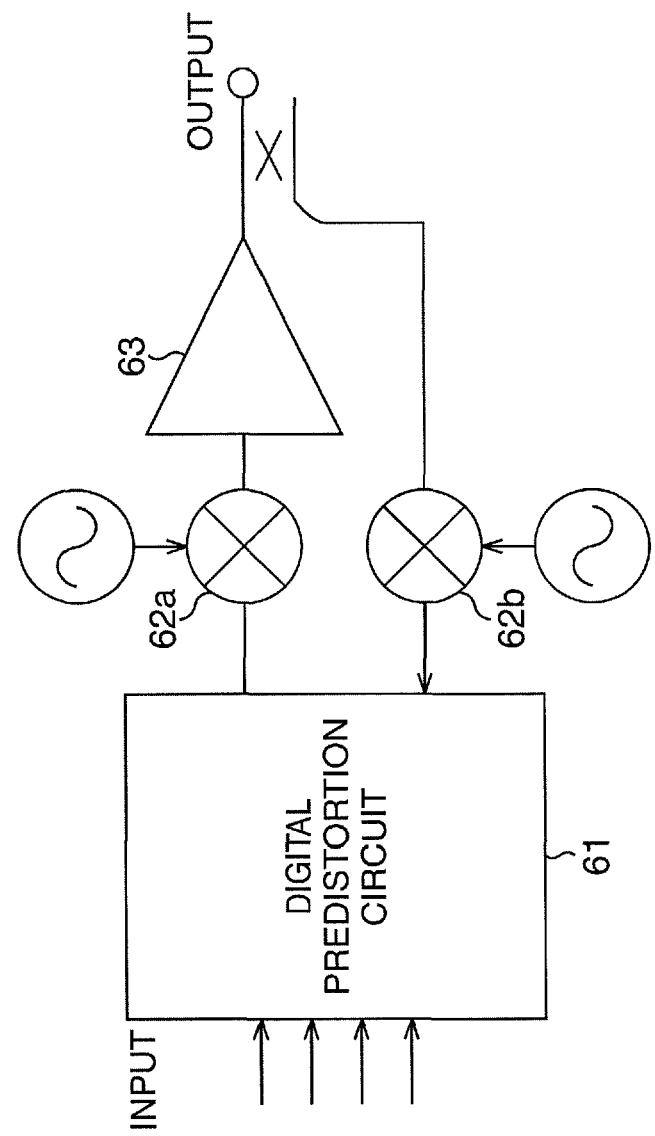
FIG. 18 is a connection wiring diagram illustrating a schematic structure of a high-frequency amplifier according to a seventh embodiment.

FIG. 18 is a connection wiring diagram illustrating a schematic structure of a high-frequency amplifier according to the seventh embodiment.

The high-frequency amplifier according to the present embodiment is applied to, for instance, a power amplifier for a base station of a mobile telephone. The high-frequency amplifier is constituted by a digital predistortion circuit 61, mixers 62a and 62b, and a power amplifier 63.

The digital predistortion circuit 61 compensates a non-linear distortion of an input signal. The mixer 62a mixes an input signal of which the non-linear distortion has been compensated, with an AC signal. The power amplifier 63 is a device for amplifying the input signal which has been mixed with the AC signal, and has the AlGaN/GaN-HEMT according to any of the first to fifth embodiments. Incidentally, the high-frequency amplifier in FIG. 18 is structured so as to be capable of sending a mixture signal of a signal in the output side and the AC signal mixed by the mixer 62b to the digital predistortion circuit 61, for instance, by switching a switch.

In the present embodiment, the AlGaN/GaN-HEMT is applied to the high-frequency amplifier, which can work in an intended normally-off operation without causing such inconveniences as increase in the sheet resistance, increase in the on-resistance and increase in the leakage current. Thereby, a highly-reliable and high-voltage resistant high-frequency amplifier is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

According to the above described embodiments, an intended normally-off operation can be realized without causing such inconveniences as increase in the sheet resistance, increase in the on-resistance and increase in the leakage current, with a relatively simple structure.

According to the present embodiments, an intended normally-off operation can be realized without causing such inconveniences as increase in the sheet resistance, increase in the on-resistance and increase in the leakage current, with a relatively simple structure.

What is claimed is:

1. A method for manufacturing a compound semiconductor device, comprising:
    forming a compound semiconductor layer above a substrate;
    forming a gate electrode above the compound semiconductor layer;
    forming a gate pad that has a current path formed between the gate electrode and itself, above the compound semiconductor layer;
    forming a semiconductor layer that is spontaneously polarized, above the compound semiconductor layer; and
    forming a gate connection layer on the semiconductor layer, wherein
    the semiconductor layer is located not under the gate electrode but under the gate connection layer and is arranged above the compound semiconductor layer apart from the gate electrode in a horizontal direction,
    the gate connection layer and the gate electrode are electrically connected with each other.

2. The method for manufacturing the compound semiconductor device according to claim 1, wherein the compound semiconductor layer comprises an electron transit layer and an electron supply layer formed above the electron transit layer, wherein
    the gate connection layer is arranged above the electron supply layer with the semiconductor layer interposed therebetween.

3. The method for manufacturing the compound semiconductor device according to claim 1, wherein
    the compound semiconductor layer has an electron transit layer, an electron supply layer is formed above the electron transit layer,
    the gate pad is connected with a pad connection layer that is formed above the electron transit layer and in a region in which the electron supply layer is not formed, and simultaneously
    the gate connection layer is arranged above the electron transit layer with the electron supply layer interposed therebetween, the electron supply layer serving as the semiconductor layer.

4. The method for manufacturing the compound semiconductor device according to claim 1, wherein the semiconductor layer is formed from a nitride semiconductor.

5. The method for manufacturing the compound semiconductor device according to claim 4, wherein the nitride semiconductor is one selected from a group consisting of GaN, AlN, InN, AlGaN, InGaN, InAlN and InAlGaN.

6. The method for manufacturing the compound semiconductor device according to claim 1, wherein the semiconductor layer is formed of an oxide semiconductor.

7. The method for manufacturing the compound semiconductor device according to claim 6, wherein the oxide semiconductor is formed from ZnO or ZnMgO.

8. The method for manufacturing the compound semiconductor device according to claim 1, wherein the semiconductor layer is formed so as to have a stacked structure.

* * * * *